United States Patent

Arima et al.

(10) Patent No.: US 10,304,752 B2
(45) Date of Patent: May 28, 2019

(54) IMAGING UNIT AND IMAGING APPARATUS

(71) Applicant: NIKON CORPORATION, Tokyo (JP)

(72) Inventors: Hirofumi Arima, Tokyo (JP); Ryoichi Suganuma, Yokohama (JP); Takuya Sato, Tokyo (JP); Satoru Suzuki, Yokohama (JP)

(73) Assignee: NIKON CORPORATION, Tokyo (JP)

( * ) Notice: Subject to any disclaimer, the term of this patent is extended or adjusted under 35 U.S.C. 154(b) by 0 days.

(21) Appl. No.: 14/454,475

(22) Filed: Aug. 7, 2014

(65) Prior Publication Data

US 2014/0339668 A1  Nov. 20, 2014

Related U.S. Application Data

(63) Continuation of application No. PCT/JP2013/000652, filed on Feb. 6, 2013.

(30) Foreign Application Priority Data

Feb. 7, 2012  (JP) ................................ 2012-024453
Mar. 2, 2012  (JP) ................................ 2012-047415
(Continued)

(51) Int. Cl.
*H01L 23/34* (2006.01)
*H01L 27/146* (2006.01)
(Continued)

(52) U.S. Cl.
CPC .......... *H01L 23/34* (2013.01); *H01L 23/4006* (2013.01); *H01L 27/14601* (2013.01);
(Continued)

(58) Field of Classification Search
CPC .......... H01L 23/34; H01L 2225/06589; H01L 2924/1461; H01L 2924/15153;
(Continued)

(56) References Cited

U.S. PATENT DOCUMENTS 5,814,883 A  *  9/1998  Sawai ..................... H01L 23/04
                                                        257/675
7,408,244 B2 *  8/2008  Lee ..................... H01L 23/49551
                                                        257/666
(Continued)

FOREIGN PATENT DOCUMENTS

CN  101312206 A  11/2008
EP  2234151 A1   9/2010
(Continued)

OTHER PUBLICATIONS

International Search Report issued in International Application No. PCT/JP2013/000652 dated Mar. 19, 2013 (with translation).
(Continued)

*Primary Examiner* — David C Spalla
(74) *Attorney, Agent, or Firm* — Oliff PLC

(57) ABSTRACT

An imaging unit comprising an imaging chip and a mounting substrate that has the imaging chip mounted thereon and includes a first metal layer for outputting a signal generated by the imaging chip to the outside. An imaging apparatus comprises an imaging unit that includes an imaging chip and a mounting substrate that has the imaging chip mounted thereon and includes a first metal layer for outputting a signal generated by the imaging chip to the outside.

24 Claims, 29 Drawing Sheets

(30) Foreign Application Priority Data

Mar. 2, 2012 (JP) .................................. 2012-047416
Aug. 2, 2012 (JP) .................................. 2012-171851

(51) Int. Cl.
H01L 23/40 (2006.01)
H04N 5/225 (2006.01)

(52) U.S. Cl.
CPC ..... H01L 27/14618 (2013.01); H04N 5/2253 (2013.01); *H01L 2224/16225* (2013.01); *H01L 2224/48091* (2013.01); *H01L 2224/48227* (2013.01); *H01L 2924/16195* (2013.01); *H04N 5/2257* (2013.01)

(58) Field of Classification Search
CPC ..... H01L 27/146; H01L 27/307; H01L 31/00; H01L 31/023; H01L 31/024
USPC .......................................... 257/678, 712, 720
See application file for complete search history.

(56) References Cited

U.S. PATENT DOCUMENTS

| | | | |
|---|---|---|---|
| 7,646,094 B2 | 1/2010 | Suminoe | |
| 2002/0074642 A1* | 6/2002 | Sekimoto | H01L 23/057 257/692 |
| 2002/0185718 A1* | 12/2002 | Mikubo | H01L 23/433 257/678 |
| 2003/0026382 A1 | 2/2003 | Takeda | |
| 2003/0038362 A1* | 2/2003 | Nomura | H01L 23/047 257/706 |
| 2004/0118501 A1* | 6/2004 | Chiu | H01L 21/4871 156/64 |
| 2005/0035436 A1* | 2/2005 | Novak | H01L 23/50 257/678 |
| 2006/0267168 A1* | 11/2006 | Misawa | H01L 27/14618 257/678 |
| 2007/0194418 A1* | 8/2007 | Suminoe | H01L 23/057 257/678 |
| 2007/0279885 A1* | 12/2007 | Basavanhally | B81B 7/0051 361/799 |
| 2008/0150065 A1* | 6/2008 | Oda | H01L 31/0203 257/434 |
| 2008/0230892 A1* | 9/2008 | Chang | H01L 25/0657 257/700 |
| 2008/0292308 A1 | 11/2008 | Iwabuchi | |
| 2009/0014762 A1 | 1/2009 | Matsuo et al. | |
| 2009/0053850 A1 | 2/2009 | Nishida et al. | |
| 2009/0290049 A1 | 11/2009 | Ukita | |
| 2010/0243872 A1* | 9/2010 | Amano | H01L 27/14618 250/238 |
| 2012/0104536 A1* | 5/2012 | Seo | H01L 27/14618 257/459 |
| 2012/0267777 A1* | 10/2012 | Haba | H01L 25/0652 257/737 |

FOREIGN PATENT DOCUMENTS

| | | |
|---|---|---|
| JP | A-2002-118773 | 4/2002 |
| JP | 2002-270743 A | 9/2002 |
| JP | 2003-32557 A | 1/2003 |
| JP | A-2004-221248 | 8/2004 |
| JP | 2006-005385 A | 1/2006 |
| JP | 2006-148473 A | 6/2006 |
| JP | 2006-303482 A | 11/2006 |
| JP | A-2007-019423 | 1/2007 |
| JP | A-2007-207918 | 8/2007 |
| JP | 2008-245244 A | 10/2008 |
| JP | A-2009-164362 | 7/2009 |
| JP | 2009-182381 A | 8/2009 |
| JP | A-2009-212270 | 9/2009 |
| JP | A-2009-232159 | 10/2009 |
| JP | A-2009-284424 | 12/2009 |
| JP | 2010-278515 A | 12/2010 |
| JP | 2011-134777 A | 7/2011 |
| JP | 2011-233716 A | 11/2011 |
| JP | A-2012-028496 | 2/2012 |
| TW | 302528 B | 4/1997 |
| TW | 200802828 A | 1/2008 |

OTHER PUBLICATIONS

International Preliminary Report on Patentability issued in International Application No. PCT/JP2013/000652 dated Aug. 12, 2014.
Sep. 24, 2015 Search Report issued in European Patent Application No. 13746286.7.
Jul. 21, 2016 Office Action issued in Chinese Application No. 201380008289.5.
Feb. 28, 2017 Office Action issued in Japanese Patent Application No. 2013-557430.
Aug. 23, 2016 Office Action issued in Japanese Application No. 2013-557430.
Apr. 20, 2017 Office Action issued in Chinese Application No. 201380008289.5.
Dec. 1, 2017 Office Action issued in European Patent Application No. 13 746 286.7.
Jan. 22, 2018 Office Action issued in Chinese Application No. 201380008289.5.
May 22, 2018 Office Action issued in Japanese Application No. 2017-137380.
Sep. 4, 2018 Office Action issued in Chinese Patent Application No. 201380008289.5.
Jul. 26, 2018 Office Action issued in European Patent Application No. 13 746 286.7.
Jan. 11, 2019 Office Action issued in Indian Application No. 7479/DELNP/2014.
Feb. 5, 2019 Office Action issued in Japanese Application No. 2017-137380.

\* cited by examiner

IMAGING UNIT AND IMAGING APPARATUS

This is a Continuation of International Application No. PCT/JP2013/000652 filed Feb. 6, 2013, which claims the benefit of Japanese Patent Application No. 2012-024453 filed on Feb. 7, 2012, Japanese Patent Application No. 2012-047415 filed on Mar. 2, 2012, Japanese Patent Application No. 2012-047416 filed on Mar. 2, 2012 and Japanese Patent Application No. 2012-171851 filed on Aug. 2, 2012. The disclosure of the prior applications is hereby incorporated by reference herein in its entirety.

BACKGROUND

1. Technical Field

The present invention relates to an imaging unit and an imaging apparatus.

2. Related Art

An imaging unit with a package structure is known, in which an imaging chip is implemented in a plastic or ceramic package. Recently, an imaging unit is known that has a COB (Chip On Board) configuration, in which an imaging chip is mounted directly on a substrate, as shown in Patent Document 1, for example. Furthermore, an imaging unit with a package configuration is known, in which the imaging chip is implemented in a ceramic package. A multilayer substrate is known in which there are multiple layers of wiring patterns. In particular, a metal core substrate is known, in which a metal layer is adopted in the core layer to improve the heat dispersion and heat resistance.

As an example, an electronic camera includes an imaging apparatus. The electronic camera acquires an image (optical image) using this imaging apparatus. Patent Document 4 describes an example of technology relating to an imaging apparatus.

Patent Document 1: Japanese Patent Application Publication No. 2002-118773
Patent Document 2: Japanese Patent Application Publication No. 2007-019423
Patent Document 3: Japanese Patent Application Publication No. 2012-028496
Patent Document 4: Japanese Patent Application Publication No. 2009-164362

There is a problem that the imaging unit cannot be made thinner.

SUMMARY

According to a first aspect of the present invention, provided is an imaging unit comprising an imaging chip and a mounting substrate that has the imaging chip mounted thereon and includes a first metal layer for outputting a signal generated by the imaging chip to the outside.

According to a second aspect of the present invention, provided is an imaging apparatus comprising the imaging unit described above.

The summary clause does not necessarily describe all necessary features of the embodiments of the present invention. The present invention may also be a sub-combination of the features described above.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
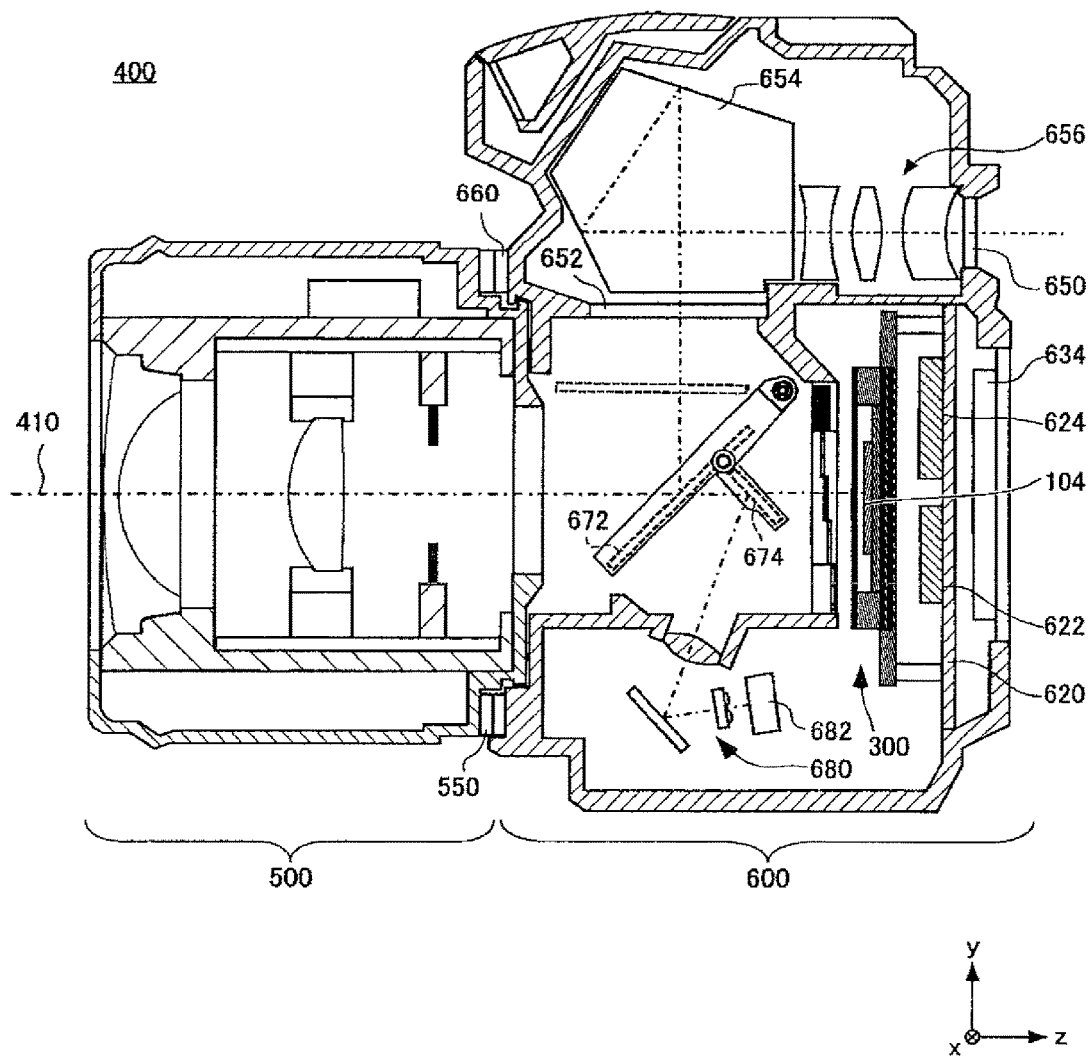
FIG. 1 is a schematic cross-sectional view of a camera, which is an example of an imaging apparatus according to a first embodiment.

FIG. 1 is a schematic cross-sectional view of a camera 400, which is an example of an imaging apparatus according to a first embodiment. The camera 400 includes a lens unit 500 and a camera body 600. The camera body 600 has a lens unit 500 attached thereto. The lens unit 500 includes an optical system arranged along an optical axis 410 within a lens barrel thereof, and guides incident subject light to an imaging chip 104 provided in an imaging unit 300 of the camera body 600. As shown in FIG. 1, the back and forth direction, which is parallel to the optical axis 410, is the z-axis direction. Furthermore, the left and right direction, which is the direction parallel to the longitudinal direction of the imaging chip 104, is the x-axis direction and the up and down direction, which is the direction orthogonal to the z-axis and the x-axis, is the y-axis direction.

The camera body 600 includes a main mirror 672 and a sub mirror 674 behind a body mount 660 connected to a lens mount 550. The main mirror 672 is axially supported to allow pivoting between an inclined position in which the main mirror 672 is inclined relative to the incident subject light from the lens unit 500 and a withdrawn position in which the main mirror 672 is withdrawn from the path of the subject light. The sub mirror 674 is axially supported to allow pivoting relative to the main mirror 672.

When the main mirror 672 is in the inclined position, the majority of incident subject light passing through the lens unit 500 is reflected by the main mirror 672 and guided to a focusing screen 652. The focusing screen 652 is arranged at a position conjugate to the imaging surface of the imaging chip 104, and causes the subject light formed by the optical system of the lens unit 500 to be visible. The subject image formed by the focusing screen 652 can be observed from a finder 650 through a pentaprism 654 and a finder optical system 656.

A portion of the subject light incident to the main mirror 672 in the inclined position passes through a half-mirror region of the main mirror 672 to be incident to the sub mirror 674. The sub mirror 674 reflects the portion of incident light from the half-mirror region toward a focusing optical system 680. The focusing optical system 680 guides a portion of the incident light to a focal point detection sensor 682. The focal point detection sensor 682 outputs a detection result to a body side CPU 622.

Behind the main mirror 672 and the sub mirror 674, an imaging unit 300, a body substrate 620, and a back surface display section 634 are arranged sequentially in the stated order. The back surface display section 634 is formed by a liquid crystal display panel, for example, and is on the back surface of the camera body 600. The body side CPU 622 and an electronic circuit such as an image processing circuit 624 are mounted on the body substrate 620.

Figure 2:
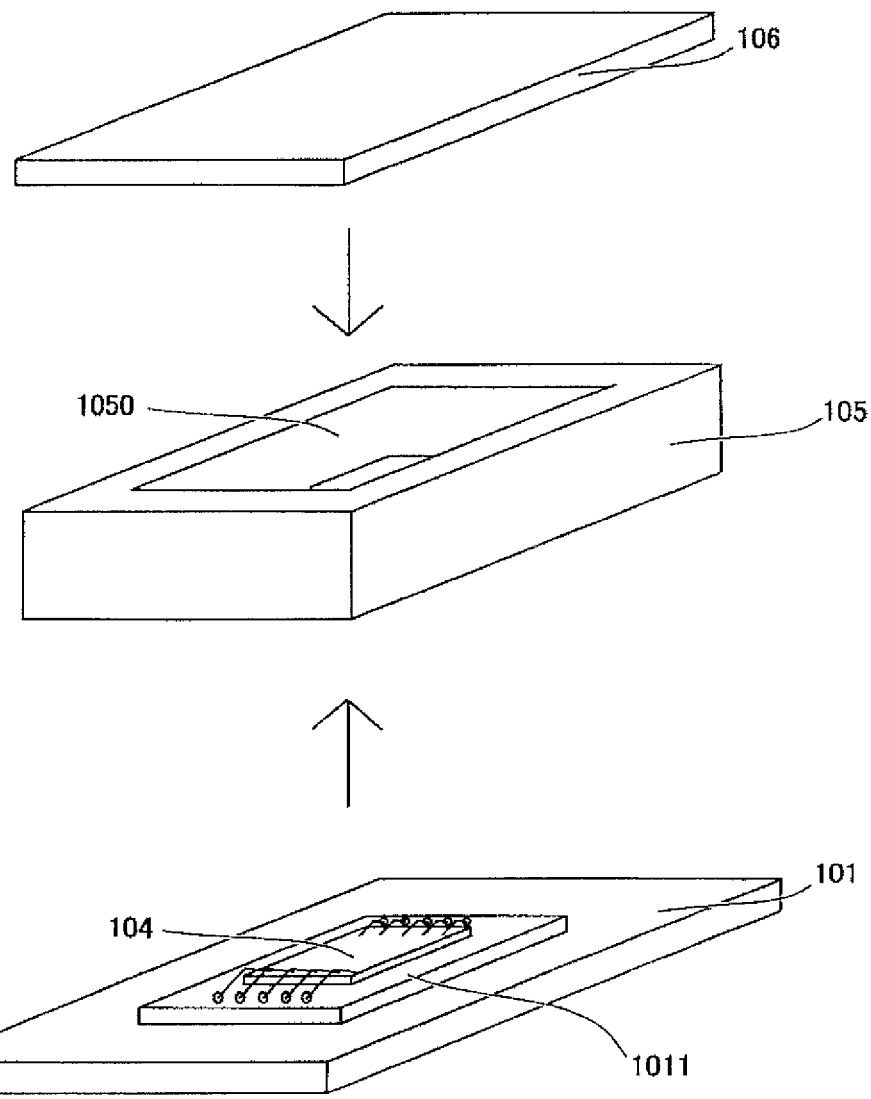
FIG. 2 is a schematic exploded perspective view of the imaging unit.

FIG. 2 is a schematic exploded perspective view of the imaging unit 300. The imaging unit 300 is formed by arranging a mounting substrate 101, an imaging chip 104, a surrounding member 105, and an optical element 106 in the stated order from the back surface display section 634 side.

The mounting substrate 101 is a square board, for example. The mounting substrate 101 has a protruding portion 1011 formed on a primary surface thereof facing the optical element 106. Here, the protruding portion 1011 is formed with a rectangular shape. The imaging chip 104 is mounted on the surface of the protruding portion 1011.

The surrounding member 105 has a shape that enables engagement with the protruding portion 1011 of the mounting substrate 101. Here, the protruding portion 1011 has a rectangular shape, and therefore, the surrounding member 105 is shaped as a rectangular ring that can engage with the rectangular protruding portion 1011. Specifically, the outer peripheral surface of the protruding portion 1011 of the mounting substrate 101 engages with the inner peripheral surface of the surrounding member 105. With the surrounding member 105 and the protruding portion 1011 of the mounting substrate 101 in an engaged state, it can be said that the region of the mounting substrate 101 surrounded by the surrounding member 105 forms a protrusion relative to the other regions. By engaging the protruding portion 1011 of the mounting substrate 101 with the surrounding member 105, the mounting substrate 101 is fixed to the surrounding member 105.

The optical element 106 has a shape and size that enables sealing of the opening 1050 of the surrounding member 105. Here, the surrounding member 105 is a rectangular ring, and therefore the optical element 106 has a rectangular shape with a size capable of sealing the opening 1050 of the surrounding member 105, which is a rectangular ring.

As described above, the imaging unit of the first embodiment has a configuration in which the protruding portion 1011 of the mounting substrate 101 is inserted into the surrounding member 105, and can therefore easily form a sealed space along with the optical element 106.

Figure 3:
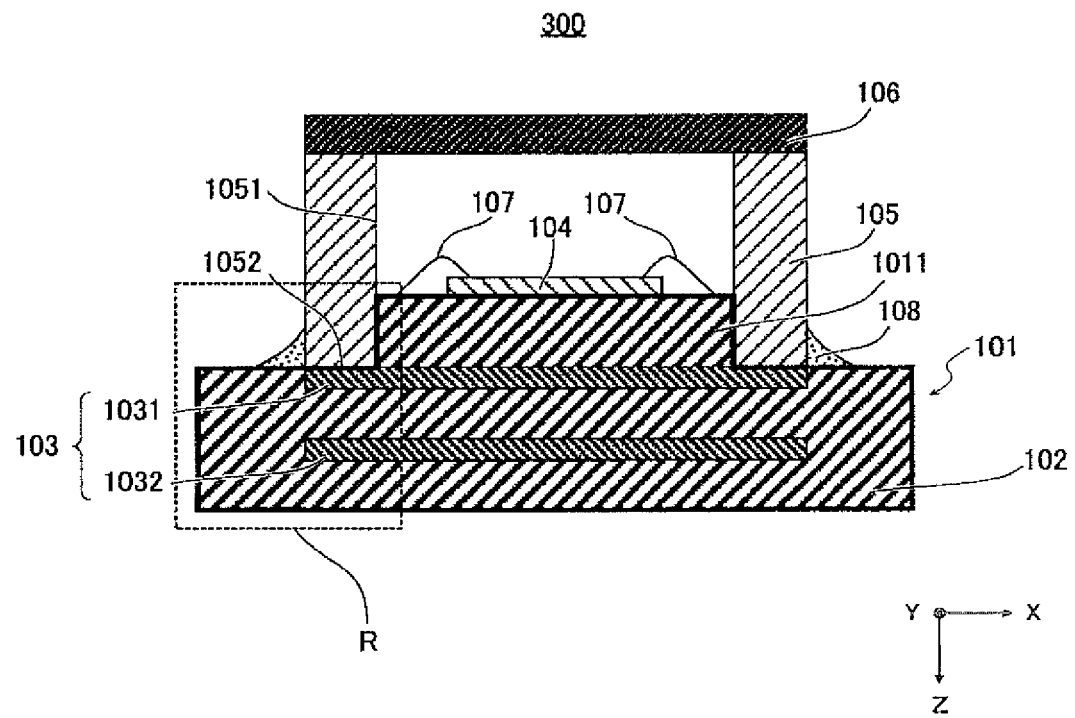
FIG. 3 is a schematic cross-sectional view of the imaging unit.

FIG. 3 is a schematic cross-sectional view of the imaging unit. As described above, the imaging unit includes the mounting substrate 101, the imaging chip 104, the surrounding member 105, and the optical element 106.

The mounting substrate 101 is a metal core substrate. Specifically, the mounting substrate 101 is a multilayer substrate in which a plurality of resin layers 102 having wiring patterns formed on the surfaces thereof are stacked together with one or more metal layers 103. The wiring patterns are omitted from the drawings. Here, the mounting substrate 101 includes two metal layers 1031 and 1032 arranged with a space therebetween in the z-axis direction. In the following description, when not making a particular distinction between the two metal layers 1031 and 1032, these layers may be referred to simply as the metal layer 103. The material for the metal layer 103 may be copper, a nickel alloy, iron, or aluminum, for example. As described above, the mounting substrate 101 has a protruding portion 1011 on the primary surface thereof facing the optical element 106. A wiring pattern is formed on the surface of the mounting substrate 101.

The imaging chip 104 includes a pixel region formed by a plurality of pixels that photoelectrically convert received subject light. The electrode portion of the imaging chip 104 and the wiring pattern formed on the surface of the protruding portion 1011 are connected by bonding wires 107. Instead, the electrode portion of the imaging chip 104 and the wiring pattern may be connected by metal bumps.

The surrounding member 105 is a metal surrounding member arranged as a frame, i.e. a metal frame, and surrounds at least a portion of the mounting substrate 101 to secure the mounting substrate 101. More specifically, the surrounding member 105 surrounds the side surfaces of at least a portion of the mounting substrate 101. Therefore, a portion of the mounting substrate 101 is inserted within the surrounding member 105 to be surrounded thereby. Here, as described above, by surrounding the protruding portion 1011 of the mounting substrate 101, the mounting substrate 101 is secured relative to the surrounding member. The surrounding member 105 is formed of a material with high water resistance and gas resistance. Specifically, the material of the surrounding member 105 may be aluminum, brass, iron, or a nickel alloy, for example.

As shown in the drawings, the width of the surrounding member 105 is substantially equal to the width of the metal layer 103. The metal layer 103 is formed over the entire region that is surrounded by the surrounding member 105. Accordingly, when the metal layer 103 is projected onto the mounting surface of the imaging chip 104, the metal layer 103 covers the surrounded region, which is the region surrounded by the surrounding member 105 (i.e. the surface region of the protruding portion 1011) without any gaps. Here, an example is shown in which the width of the surrounding member 105 is substantially equal to the width of the metal layer 103, but the width of the metal layer 103 may be greater than the width of the surrounded region.

The optical element 106 is a cover glass that covers the imaging chip 104. An optical low-pass filter may be used as the optical element 106. The optical element 106 is adhered to the surrounding member 105 facing the mounting substrate 101. The adhesive agent can be a silicon-type adhesive agent. A seal material 108 is used to seal the border between the surrounding member 105 and the mounting substrate 101 from the outside. The seal material 108 can be a resin for forming semiconductors.

The opening on the mounting substrate 101 side of the surrounding member 105 is sealed as a result of the protruding portion 1011 of the mounting substrate 101 being inserted therein. In other words, the surrounding member 105 can be said to be arranged to contact the protruding portion shape of the mounting substrate 101. The opening on the optical element 106 side of the surrounding member 105 is sealed by the optical element 106. Accordingly, a sealed space is formed by the surrounding member 105, the mounting substrate 101, and the optical element 106. The imaging chip 104 is arranged within this sealed space.

As described above, the mounting substrate 101 includes a resin layer 102. The resin layer 102 could act as an inlet path for gas and liquid from the outside. If liquid and gas were to enter within the imaging unit, the imaging capability of the imaging chip 104 would be reduced. Specifically, when liquid enters into the sealed space, the temperature difference relative to the outside of the sealed space causes condensation on the imaging chip 104 and the cover glass. When there is condensation or mold resulting from condensation, the captured optical image becomes distorted, and therefore the quality of the output image is reduced. On the other hand, when gas enters into the sealed space, oxidation and corrosion of the circuits within the imaging chip 104 progresses, thereby incurring damage to the imaging chip 104.

With the imaging unit according to the first embodiment, the imaging chip 104 is provided in a sealed space with excellent water resistance and gas resistance, and it is therefore difficult for liquid or gas to be introduced from the outside. The following describes the method for preventing the incursion of liquid and gas from the outside.

Figure 4:
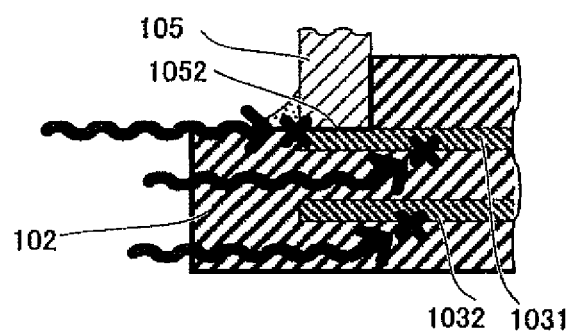
FIG. 4 is a view for describing the prevention of incursion of water and gas from the outside.

FIG. 4 is a view for describing the prevention of incursion of liquid and gas from the outside. Specifically, FIG. 4 focuses on the region R shown in FIG. 3. In FIG. 4, the arrows indicate the incursion of liquid and gas. As shown in FIG. 4, the resin layer 102 sandwiched between the upper and lower metal layers 1031 and 1032 can be considered to be a path through which liquid and gas enter.

However, in the first embodiment, the metal layer 1031 is present in the region corresponding to the surrounded region. Compared to the resin, the metal layer 1031 has a greater ability to block liquid and gas. Accordingly, the liquid and gas that enters from the resin layer 102 sandwiched between the upper and lower metal layers 1031 and 1032 is blocked by the upper metal layer 1031, and does not reach the sealed space. Similarly, the liquid and gas entering from the bottommost resin layer is blocked by the lower metal layer 1032, and cannot reach the sealed space.

Furthermore, other incursion paths include contact portions between the end surfaces 1052 of the surrounding member 105 and the mounting substrate 101. However, in the first embodiment, the end surfaces 1052 of the surrounding member 105 contact the surface of the upper metal layer 1031. Since this contact is metal on metal, compared to contact between resin and metal, the sealing performance is higher. Accordingly, the prevention of the incursion of liquid and gas is more effective.

As described above, the incursion of liquid and gas from the resin layer 102 of the mounting substrate 101 is blocked by the metal layer 103, and the incursion of liquid and gas from the contact portions between the mounting substrate 101 and the end surfaces 1052 of the surrounding member 105 can be prevented. Accordingly, degradation of the imaging chip 104 due to liquid and gas can be prevented.

Furthermore, the mounting substrate 101 of the first embodiment has side surface formed by having a portion thereof protrude. Since the ring surface is in contact along these side surfaces, the creepage distance can be extended more than in a case where the mounting substrate 101 is flat. Here, the "creepage distance" refers to the shortest distance when liquid and gas attempt to enter into the sealed space from the outside. By increasing the creepage distance, the resistance of the imaging unit to liquid and gas can be increased.

The side surfaces of the protruding portion 1011 of the mounting substrate 101 are surrounded by the surrounding member 105, and therefore particles occurring in the cross-sectional plane of the mounting substrate 101 can be restricted from entering into the sealed space. As a result, particles occurring in the cross-sectional plane can be prevented from attaching to the imaging chip 104. Furthermore, the surrounding member 105 can prevent substrate dust generated from the cross-sectional plane of the mounting substrate 101 from entering into the space where the imaging chip 104 is mounted.

In addition to the protruding portion 1011 of the mounting substrate 101 engaging with the surrounding member 105, the contact portions between the mounting substrate 101 and the end surfaces 1052 of the surrounding member 105 are sealed by the seal material 108, and therefore the incursion of liquid and gas from the outside can be farther prevented.

<First Modification>

The following describes a modification in which the shape of the mounting substrate is changed. The mounting substrate according to the first modification differs from the mounting substrate of FIG. 3 in that there is a groove into which the surrounding member is inserted, instead of the protruding portion.

Figure 5:
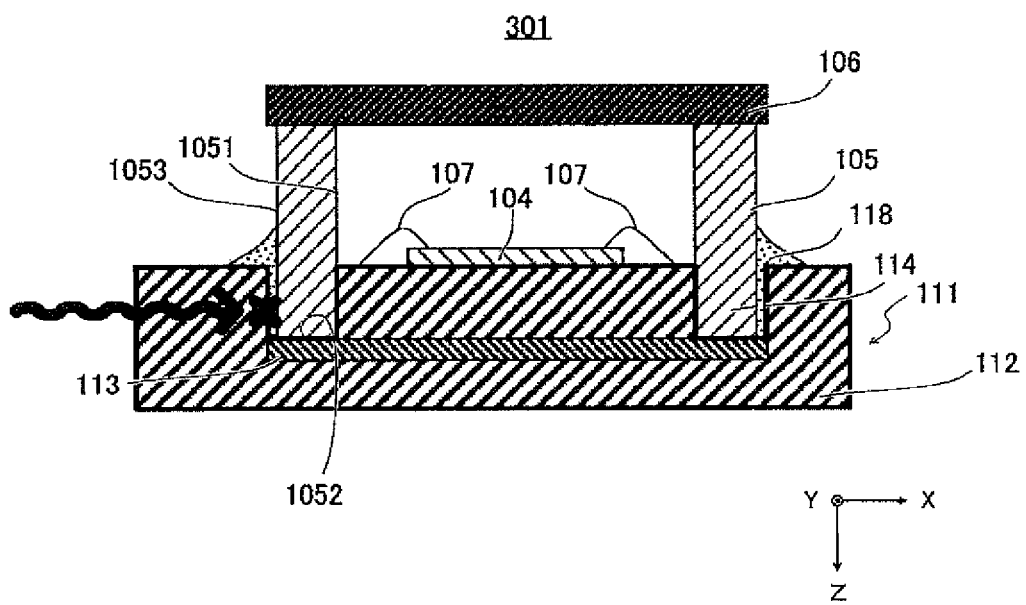
FIG. 5 is a schematic cross-sectional view of the imaging unit according to the first modification.

FIG. 5 is a schematic cross-sectional view of the imaging unit 301 according to the first modification. As described above, when the surrounding member 105 is a rectangular ring, a groove 114 is formed to surround the periphery of the imaging chip 104 in the mounting substrate 111. Furthermore, the metal layer 113 is shown as a single layer.

In the first modification, the surrounding member 105 is inserted into the groove 114. When the ring surface 1051 of the surrounding member 105 is inserted into the groove 114, there is a gap between the side walls of the groove 114 and the outer peripheral surface 1053 of the surrounding member 105. In the first modification, the seal material 118 seals the border between the surrounding member 105 and the mounting substrate 111 from the outside, and also fills in the gap between the groove 114 and the surrounding member 105.

In addition to the ring surface 1051 and the end surfaces 1052 of the surrounding member 105, a portion of the outer peripheral surface 1053 of the surrounding member 105 is also in contact with the mounting substrate 111 via the seal material 118. The seal material 118 keeps out liquid and gas, and therefore the creepage distance can be further increased. As a result, the resistance of the imaging unit 301 to liquid and gas can be further increased.

Furthermore, with the first modification, a path through the resin layer 112 between the metal layer 113 and the surface of the mounting substrate 111, for example, can be thought of as a liquid and gas incursion path. However, the end surfaces 1052 of the surrounding member 105 contact the surface of the metal layer 113, and therefore the liquid and gas entering from the resin layer 112 are blocked by the surrounding member 105.

<Second Modification>

In the above description, there is no specific description of the wiring patterns formed on the mounting substrate. As described above, if possible, one metal layer can cover the entire surrounded region, but in reality, there are cases where it is necessary to form openings in the metal layer for inserting wiring patterns. In such a case, the entire surrounded region cannot be covered by a single metal layer. The second modification describes an example in which the entire imaging chip 104 is covered by a plurality of metal layer.

Figures 6A, 6B:
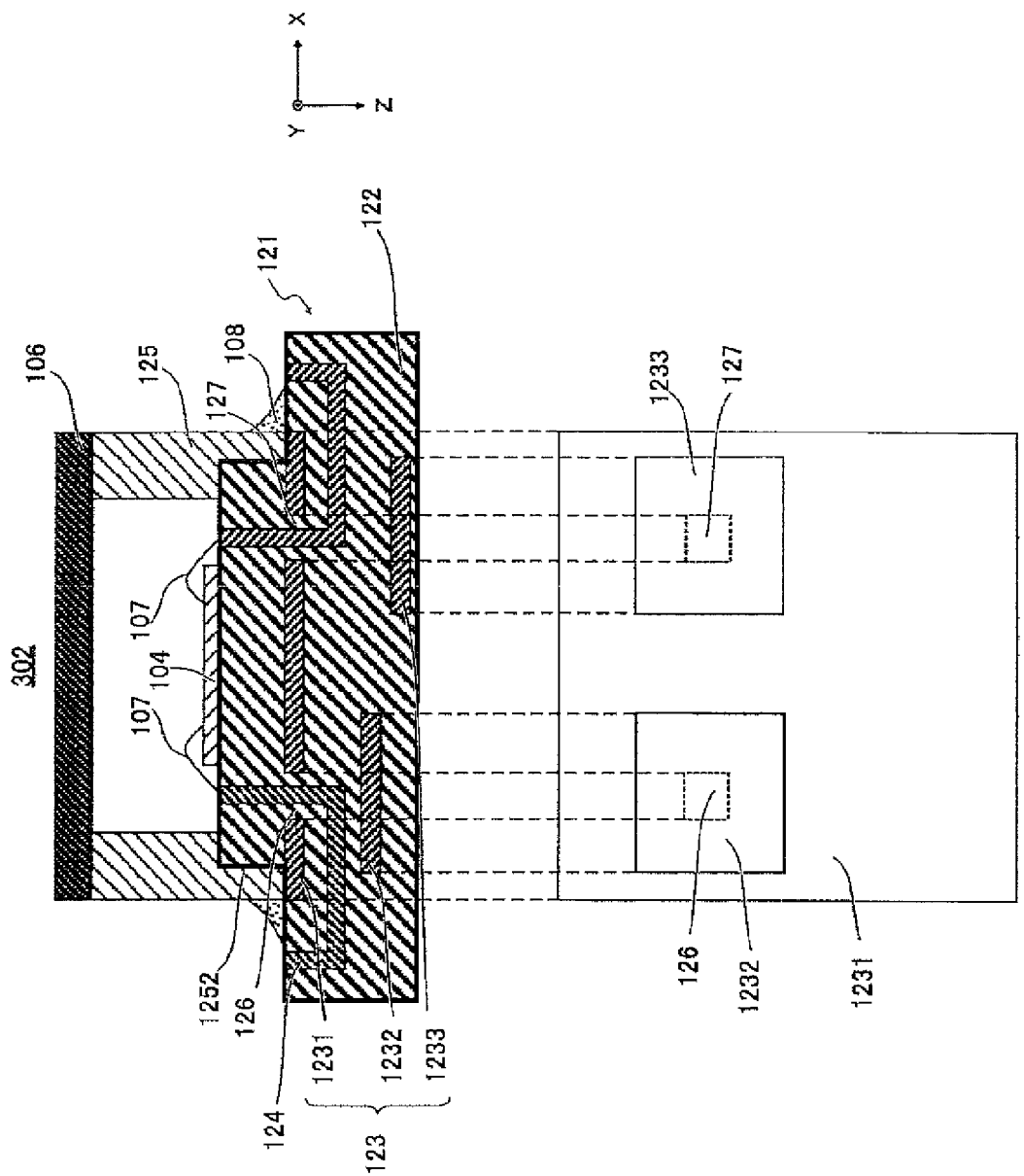
FIG. 6A shows a schematic cross section of an imaging unit according to the second modification.
FIG. 6B shows a projection of the three metal layers overlapping the mounting surface.

FIGS. 6A and 6B are used to describe the positional relationship between the surrounded region and the metal layers in the second modification. FIG. 6A shows a schematic cross section of an imaging unit 302 according to the second modification.

The mounting substrate 121 is a multilayer substrate formed by stacking a resin layer 122 with a wiring pattern formed on the surface thereof and a metal layer 123. Here, the mounting substrate 121 includes three metal layers 1231, 1232, and 1233 arranged with spaces therebetween in the z-axis direction.

Focusing on the metal layer 1231 nearest the imaging chip 104, this metal layer 1231 has an opening 127 and an opening 126 for inserting a wiring pattern 124. Accordingly, a portion of the surrounded region is not covered by the metal layer 1231.

FIG. 6B shows a projection of the three metal layers 1231, 1232, and 1233 overlapping the mounting surface of the imaging chip 104. As shown in FIGS. 6A and 6B, the region corresponding to the opening 126 formed in the metal layer 1231 is filled by the metal layer 1232. Furthermore, the region corresponding to the opening 127 formed in the metal layer 1231 is filled by the metal layer 1233.

Accordingly, the overall structure of the three metal layers 1231, 1232, and 1233 covers the surrounded region without gaps. In other words, in this case, the mounting substrate 121 does not have a through-via (through-hole) that penetrates therethrough in the z-axis direction. Here, as shown in the drawings, the wiring pattern 124 is drawn from the surface of the mounting substrate 121 on the outside of the region sealed by the seal material 108.

If a through-via were to be formed, there would be a concern that liquid and gas would enter in through the through-via. In the imaging unit of the second modification, no through-via is formed, and therefore the incursion of liquid and gas is less than in a case where a through-via is formed.

Here, the overall structure of the three metal layers 1231, 1232, and 1233 covers the surrounded region without gaps, but a structure including only two of the three metal layers 1231, 1232, and 1233 may cover the surrounded region without gaps. In other words, when at least a portion of the plurality of metal layers are projected onto the mounting surface of the imaging chip 104, this portion of the metal layers should cover the region surrounded by the surrounding member without gaps.

With the second modification, the surrounding member 125 is formed with stepped end surfaces 1252. As a result, the creepage distance can be further increased. The number of steps in the end surfaces 1252 of the surrounding member 125 formed with a stepped shape is not limited to one, and there may be multiple steps. In this case, the creepage distance can be further increased.

Furthermore, the shape of the end surfaces of the surrounding member 125 is not limited to a stepped shape, and instead one of the mounting substrate 121 and the end surfaces of the surrounding member 125 may have a recess while the other has a protrusion corresponding to the recess. In this way, the creepage distance can be further increased.

<Third Modification>

Figure 7:
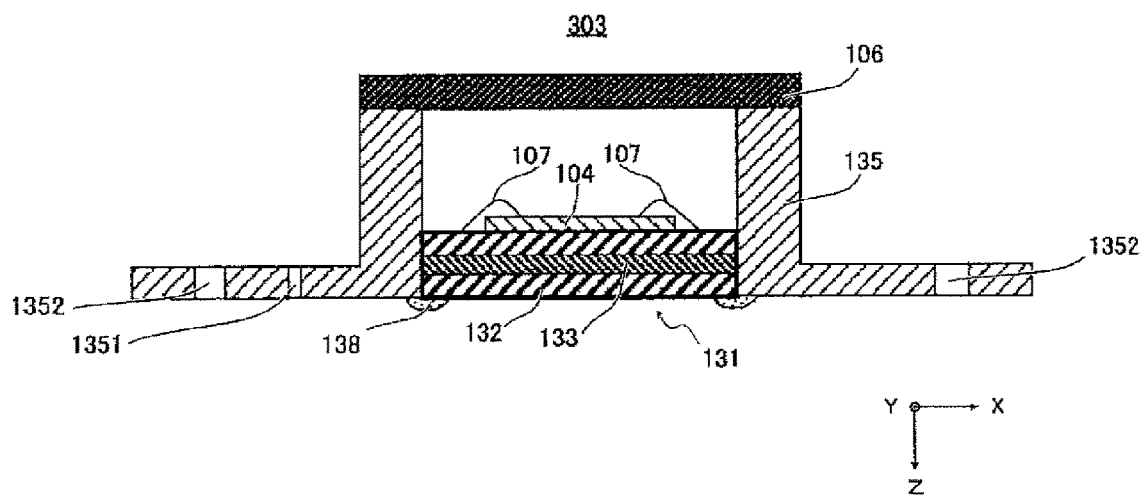
FIG. 7 is a schematic cross-sectional view of an imaging unit according to the third modification.

The following describes a modification in which the shapes of the mounting substrate and the surrounding member are switched. FIG. 7 is a schematic cross-sectional view of an imaging unit according to the third modification. Here, the entire side surface of the mounting substrate 131 is surrounded by the surrounding member 135 and secured. Accordingly, in this case, the resin layer 132 and the contact portions between the surrounding member 135 and the mounting substrate 131, which are the liquid and gas incursion paths, are only on the side opposite the mounting surface of the imaging chip 104. The incursion of liquid and gas in a direction of the side surface (i.e. the left and right direction), is blocked by the surrounding member 135, and therefore the resistance to incursion of liquid and gas can be further increased. In addition, the seal material 138 is provided at the contact portion between the surrounding member 135 and the mounting substrate 131, which are on the side opposite the mounting surface of the imaging chip 104. As a result, the incursion of liquid and gas from the direction of the side opposite the mounting surface of the imaging chip 104 can be prevented.

Here, the surrounded region and the metal layer 133 are the same size. In this case as well, the entire surrounded region is covered by the metal layer 133, and therefore there is resistance to the incursion of liquid and gas.

In the third modification, a portion of the surrounding member 135 surrounding the mounting substrate 131 is formed to extend in a primary surface direction of the mounting substrate 131. In this extending portion, a reference hole 1351 is formed to act as a positioning portion to show a positional reference for the imaging chip 104. The imaging chip 104 is mounted on the mounting substrate 131, and therefore the imaging chip 104 is positioned by engaging the mounting substrate 131 with the surrounding member 135. The relative positions of the reference hole 1351 and the imaging chip 104 may be determined as desired. In the manner described above, the reference hole 1351 is formed in the surrounding member 135, and therefore the attachment accuracy of the imaging chip 104 can be improved.

The extending portion further includes an attaching portion 1352 for attaching structures other than the mounting substrate 131, the imaging chip 104, and the optical element 106. Here, the attaching portion 1352 is realized by a hole, but may instead be realized by a protrusion. The attaching portion 1352 is attached to the camera casing, for example. Accordingly, in the imaging unit according to the third modification, in addition to preventing the incursion of liquid and gas, the imaging unit can be easily attached to the camera casing and realizes a lower cost by reducing the number of components.

There may be cases where light is reflected within the sealed space formed by the mounting substrate, the surrounding member, and the optical element. Therefore, an anti-reflection coating may be applied to at least a portion of the inside of the sealed space. As a result, diffused reflection within the sealed space can be reduced. For example, a low reflection component may be formed on the ring surface of the surrounding member as the anti-reflection coating. Ink can be used as this low reflection component. This low reflection component is not limited to being formed on the surrounding surface of the surrounding member, and may instead be formed in regions of the mounting substrate other than the imaging chip mounting surface.

In addition, a solder resist with a low-reflection color can be used as a solder resist of the mounting substrate, thereby reducing the diffused reflection of light. The low-reflection color may be black or deep green, for example.

In the above description, the width of the surrounding member is constant, but the width of the end surface portions of the surrounding member may be greater than the width of other portions of the surrounding member. As a result, the creepage distance can be further increased.

In the above description, the end surfaces of the surrounding member are in contact with the surface of the metal layer, but these end surfaces may instead be in contact with the resin layer. In this case, the wire pattern may be formed on the resin layer between the end surfaces of the surrounding member and the metal layer. With this configuration, there is no opening formed in the metal layer to insert the wiring pattern, and the wiring pattern can be drawn to the outside of the surrounded region.

In the above description, the metal layer and the wiring pattern are formed separately, but the metal layer 103 may be used as the wiring pattern. Furthermore, the mounting substrate is described as a multilayer substrate, but may instead be a single layer substrate. In the first embodiment, a single lens reflex camera 400 is described as an example of the imaging apparatus, but a camera body 600 may be used as the imaging apparatus. The imaging apparatus is not limited to a camera with an exchangeable lens and a mirror unit, and may instead be a camera with an exchangeable lens and no mirror unit or a camera with an integrated lens and either a mirror unit or no mirror unit. Furthermore, the imaging unit can be adapted for an imaging unit mounted on a mobile telephone, for example.

In the above example, the surrounding member is metal, but the material of the surrounding member may instead be ceramic, plastic with high water resistance, or a component coated with a water resistant material, for example. When a material other than metal is used for the surrounding member, if the same material is used for the surrounding member and the optical element, then the surrounding member and the optical element may be formed integrally. When plastic is used as the material for the surrounding member, for example, the surrounding member can be formed integrally with the optical element.

An imaging unit having a COB configuration is more beneficial than an imaging unit with a packaged configuration in terms of miniaturization and thinness, but has a problem of inferior resistance to liquid and gas, e.g. sulfur dioxide gas in the atmosphere. However, with the imaging unit according to the first embodiment, this problem can be lessened.

Figure 8A:
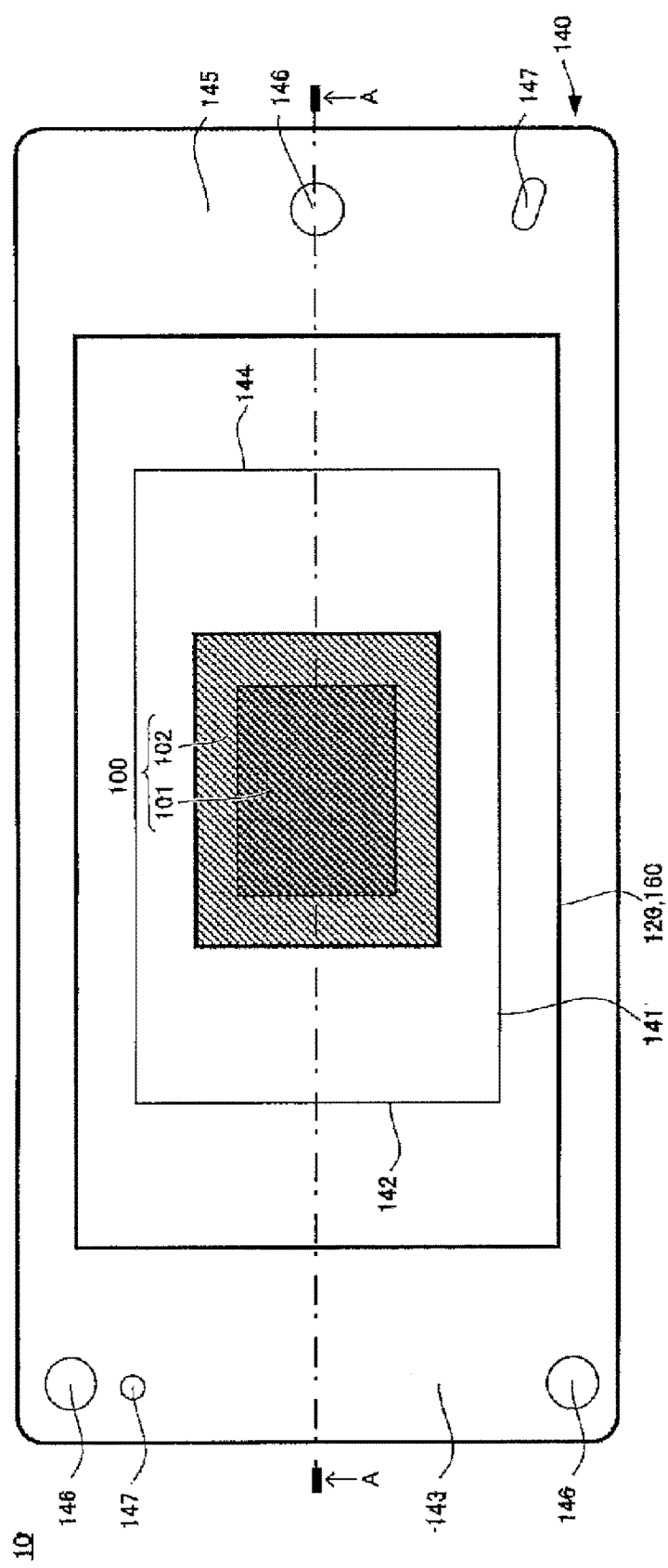
FIG. 8A is a schematic overhead view of the imaging unit.
Figure 8B:
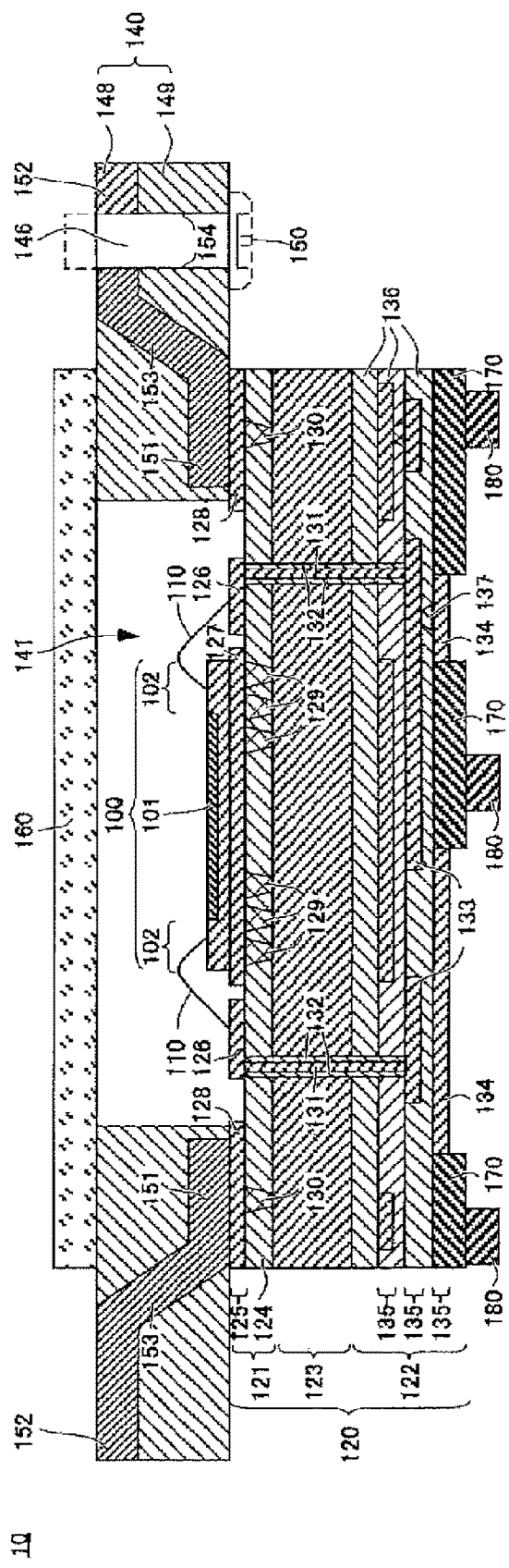
FIG. 8B is a schematic cross-sectional view of the imaging unit over the line A-A shown in FIG. 8A.

FIGS. 8A and 8B show a configuration of an imaging unit 10 according to a second embodiment. FIG. 8A is a schematic overhead view of the imaging unit 10. FIG. 8B is a schematic cross-sectional view of the imaging unit 10 over the line A-A shown in FIG. 8A. The imaging unit 10 includes an imaging chip 100, a mounting substrate 120, a surrounding member 140 serving as the surrounding member that surrounds the imaging chip 100, and an optical element 160.

The imaging chip 100 is a surface emission MOS image sensor. The imaging chip 100 includes an imaging region 101 and a peripheral region 102. The imaging region 101 is formed in a central portion of the imaging chip 100. The imaging chip 100 includes a plurality of pixels that photoelectrically convert subject light received in the imaging region 101. The peripheral region 102 is formed around the imaging region 101. The imaging chip 100 includes, in the peripheral region 102, a bus driver that reads and outputs a pixel signal obtained by the photoelectric conversion to the peripheral region and a processing circuit that performs signal processing on the output pixel signal. The processing circuit includes an AD conversion circuit that converts the output pixel signal into a digital signal. The imaging chip 100 is mounted on the mounting substrate 120, and is housed in the opening 141 of the surrounding member 140.

The mounting substrate 120 is a metal core substrate on which the imaging chip 100 is mounted. Specifically, the mounting substrate 120 includes a first layer 121, a second layer 122, and a core layer 123. The core layer 123 is sandwiched by the first layer 121 and the second layer 122. The overall thickness of the mounting substrate 120 is approximately from 0.8 mm to 3 mm.

The first layer 121 includes a prepreg layer 124 that is a resin layer and a wiring pattern 125 that is formed on the surface of the prepreg layer 124. The material for the wiring pattern 125 can be a nickel and iron alloy (e.g. a 42 alloy or 56 alloy), copper, aluminum, or the like. The wiring pattern 125 includes a wire 126, a wire 127, and a wire 128. The thickness of the wiring pattern 125 is approximately from 30 µm to 40 µm. The wire 126 is electrically connected to the imaging chip 100 by the bonding wire 110. The imaging chip 100 is implemented on the wire 127, and the surrounding member 140 is fixed to the wire 128. The imaging chip 100 is preferably in full contact with the wire 127, in consideration of heat dispersion. Similarly, the surrounding member 140 is preferably in full contact with the wire 128.

The first layer 121 further includes a plurality of thermal vias 129. The thermal vias 129 are formed directly below the imaging chip 100. The thermal vias 129 formed directly below the imaging chip 100 thermally couple the core layer 123 to the imaging chip 100. Accordingly, the thermal vias 129 function as a heat transfer path that transfers the heat generated by the imaging chip 100 to the core layer 123. The thermal vias 129 may be formed to correspond to a heat generating region of the imaging chip 100. The peripheral region 102 generates more heat than the image region, and therefore the thermal vias 129 are preferably formed directly below the peripheral region 102. In particular, the thermal vias 129 are preferably formed directly below the bus driver and the AD conversion circuit, which generate a large amount of heat. A greater number of thermal vias 129 may be formed directly below the peripheral region 102 than directly below the imaging region 101. In other words, the density of the thermal vias arranged in the region corresponding to the peripheral region 102 may be greater than the density of the thermal vias arranged in the region corresponding to the imaging region 101.

The first layer 121 further includes a plurality of thermal vias 130. The thermal vias 130 are formed directly below the surrounding member 140. The thermal vias 130 formed directly below the surrounding member 140 thermally couple the core layer 123 to the metal body 148, described further below. Accordingly, the thermal vias 130 function as a heat transfer path that transfers the heat transferred to the core layer 123 to the metal body 148.

The core layer 123 is a metal core. The material for the core layer 123 can be a nickel and iron alloy (e.g. a 42 alloy or a 56 alloy), copper, aluminum, or the like. The thickness of the core layer 123 is greater than the thickness of the wiring pattern 125 of the first layer 121 and the wiring pattern 135 of the second layer 122, described further below. Specifically, the thickness of the core layer 123 is approximately from 0.1 mm to 0.4 mm. Therefore, the rigid strength of the core layer 123 is greater than the rigid strength of the first layer 121 and the second layer 122, if the wiring pattern 125, the wiring pattern 135, and the core layer 123 are made of the same material. The core layer 123 is distinguished from the wiring pattern 125 of the first layer 121 and the wiring pattern 135 of the second layer 122 with respect to the heat dispersion and rigid strength. A more detailed description is provided further below, but in particular, the core layer 123 is distinguished from the wiring pattern 125 and the wiring pattern 135 by realizing the function of a heat dispersion path for dispersing the heat generated by the imaging chip 100.

The core layer 123 can also be used as a ground. In this case, the core layer 123 is connected to a ground line of the wiring pattern 125 and the wiring pattern 135.

The second layer 122 includes a prepreg layer 136, which is a resin layer, and three wiring patterns 135 formed within the prepreg layer 136 and on the surface of the prepreg layer 136 facing away from the core layer 123. The wiring pattern 135 includes a wire 133 and a wire 134. The thickness of the wiring pattern 135 is approximately from 30 μm to 40 μm. A portion of the surface of the second layer 122 facing away from the core layer 123 is protected by a solder resist 170.

The wire 126 and the wire 133 are electrically connected by the via 131. The via 131 is covered by an insulator 132. The pixel signal output from the imaging chip 100 is transmitted to the wire 133 through the wire 126 and the via 131.

The surrounding member 140 includes an opening 141 in the central portion thereof. The surrounding member 140 includes a first edge 143 along a first side 142 of the opening 141, and a second edge 145 along a second side 144 that is opposite the first side 142. The first edge 143 and the second edge 145 each have an attachment hole 146 serving as an attaching portion. Here, an attachment hole 146 is formed at each of the top and bottom ends of the first edge 143 within the plane of the drawing, and an attachment hole 146 is formed in the central portion of the second edge 145. The attachment holes 146 are used to attach other structures. The other structures are screwed onto the surrounding member 140 via the attachment holes 146. The other structure may include a mirror box, for example, as described further below.

Furthermore, the first edge 143 and the second edge 145 each have a positioning hole 147. Here, an engagement hole is formed as the positioning hole 147 of the first edge 143 and an oblong hole is formed as the positioning hole 147 of the second edge 145. When attaching the imaging unit 10 to a mirror box, the mirror box has a positioning pin that protrudes to the imaging unit 10 side. The positioning hole 147 is formed at a position corresponding to the positioning pin. A shutter unit is fastened together with the imaging unit 10 and the mirror box. The shutter unit is accurately positioned relative to the mirror box by the positioning pin inserted into the positioning hole 147.

The surrounding member 140 surrounds the imaging chip 100. The surrounding member 140 is formed by inserting a metal body 148 into the resin 149. The metal body 148 is an example of a metal component. The metal body 148 is formed as a ring that surrounds the opening 141, for example. A more detailed description is provided later, but the metal body 148 is formed three-dimensionally by the first edge 143 and the second edge 145. The material for the metal body 148 can be a nickel and iron alloy (e.g. a 42 alloy or a 56 alloy), copper, aluminum, or the like. When focusing on making the surrounding member 140 lightweight, aluminum may be used, as it is the lightest of the above materials. On the other hand, when focusing on the heat dispersion characteristic of the surrounding member 140, copper may be used, as it has the highest thermal conduction rate of the above materials.

If the 56 alloy, which has a linear expansion coefficient that is closest to the linear expansion coefficient of the optical element 160, is used, the warping caused by differences in the linear expansion coefficient between the optical element 160 and the surrounding member 140 can be decreased. When the 42 alloy, which has a linear expansion coefficient that is closest to the linear expansion coefficient of the imaging chip 100, is used as the material for the wiring pattern 135, the wiring pattern 125, and the core layer 123 of the mounting substrate 120, the 42 alloy may also be used as the material for the surrounding member 140. In this way, the warping of the imaging unit 10 can be decreased.

The following describes the thickness of the surrounding member 140. The thickness of the surrounding member 140 is adjusted as needed in consideration of various factors such as the distance to be ensured between the optical element 160 and the light receiving surface of the imaging chip 100 and the rigid strength of the surrounding member 140. Here, if debris or foreign material becomes stuck to the optical element 160 or the optical element 160 is damaged, the reflection of this debris or the like can be decreased as the optical element 160 becomes farther from the light receiving surface of the imaging chip 100. Accordingly, in consideration of decreasing the effect of this reflection, it is preferable for the distance between the optical element 160 and the light receiving surface of the imaging chip 100 to be greater. Accordingly, the thickness of the surrounding member 140 is preferably greater. This reflection is also affected by the size of the imaging chip 100. For example, when the imaging chip 100 is smaller, the depth of field is greater, and therefore the effect is more likely to occur when the distance between the optical element 160 and the light receiving surface of the imaging chip 100 is smaller. Accordingly, the thickness of the surrounding member 140 is preferably greater. In addition, in consideration of the rigid strength of the surrounding member 140, the thickness of the surrounding member 140 is preferably greater.

On the other hand, the distance between the optical element 160 and the light receiving surface of the imaging chip 100 overlaps with other structures, and therefore there is a limit on this distance for each type of imaging apparatus in which the imaging unit 10 is implemented. With the second embodiment, the thickness of the surrounding member 140 enables adjustment to satisfy the distance limitation for each type of apparatus. Furthermore, by having a certain thickness, the surrounding member 140 itself can function as a structure that directly connects to other structures.

The metal body 148 includes a bottom edge 151 formed on the mounting substrate 120 side, a top edge 152 formed on the optical element 160 side, and a connecting portion 153 that connects the bottom edge 151 and the top edge 152. The bottom edge 151 and the top edge 152 are formed parallel to different planes. By forming the metal body 148 three-dimensionally, the rigid strength of the surrounding member 140 can be increased. If the imaging unit 10 is attached to another structure, the top edge 152 contacts this other structure. Accordingly, the heat dispersion can be increased by increasing the surface area of the top edge 152.

The end surface of the bottom edge 151, i.e. the end surface of the surrounding member 140 on the imaging chip 100 side, does not have the metal body 148 exposed. The metal body 148 is covered by the resin 149, and therefore the reflection that can occur at the opening end surface of the surrounding member 140 of the surrounding member 140 can be decreased. Furthermore, the bottom edge 151 directly contacts the wire 128.

An attachment hole 146 is formed passing through the top edge 152 and the resin 149, to enable the screw 150 to pass through to the portion where the top edge 152 and the resin 149 are layered. Accordingly, the top edge 152 forms a portion of the inner wall surface 154 of the attachment hole 146. Therefore, when the imaging unit 10 is screwed to another structure, the top edge 152 is in contact with the screw 150. A more detailed description is provided further below, but when the heat transfer path is formed in this way, the heat escapes to the structure side through the metal screw 150. If the entire inner wall surface 154 of the attachment hole 146 is formed by the metal body 148, the heat dispersion can be further increased.

The optical element 160 is a cover glass that covers the imaging chip 100. The optical element 160 is secured to the surrounding member 140 in a manner to cover the opening 141, and forms a sealed space in the opening 141 together with the mounting substrate 120. Specifically, the optical element 160 is bonded to the surrounding member 140 by an adhesive agent. The material for the optical element 160 can be borosilicate glass, quartz glass, non-alkali glass, heat resistant glass, or the like.

The sealed space is formed by the mounting substrate 120, the surrounding member 140, and the optical element 160. The imaging chip 100 is arranged in the sealed space. As a result, although explained in greater detail further below, the pixels are not easily affected by the outside environment, and a decrease in image quality can be prevented.

The electronic component 180 is a capacitor, resistor, or resistance, for example. These electronic components 180 form a power supply circuit that supplies power to a circuit within the imaging chip 100, for example. The electronic components 180 are implemented on a surface of the second layer 122 that faces away from the core layer 123. The electronic components 180 and the wire 134 of the second layer 122 are electrically connected by solders. A connector may be provided on the surface of the second layer 122 that faces away from the core layer 123. The connector is connected to a flexible substrate, for example. In this case, the pixel signal transmitted to the wire 133 is transmitted to the wire 134 through the via 137 and is then transmitted to an external processing circuit through the connector and the flexible substrate.

The following describes the heat transfer path of the imaging unit 10. The heat generated by the imaging chip 100 is transferred to the core layer 123 through the wire 127 and the thermal vias 129. The heat transferred to the core layer 123 is transferred to the metal body 148 through the thermal vias 130 and the wire 128. The heat transferred to the metal body 148 is released to other structures through the screw 150. By including the core layer 123 in the mounting substrate 120 as described above, a heat transfer path can be constructed that transfers the heat of the imaging chip 100 to the metal body 148.

As shown in FIGS. 8A and 8B, the first layer 121 is a single-layer wire layer, while the second layer 122 is a multilayer wire layer. In other words, the core layer 123 is positioned to be shifted to the side on which the imaging chip 100 is mounted. If the first layer 121 is a multilayer wire layer, the thickness of the prepreg layer of the first layer 121 increases, and therefore the heat dispersion is reduced.

In the imaging unit 10 of the second embodiment, the first layer 121 is a single-layer wire layer, and therefore the core layer 123 is closer to the imaging chip 100 than in a case where the first layer 121 is a multilayer wire layer. In other words, the thickness of the prepreg layer 124 is less than in a case where the first layer 121 is a multilayer wire layer. Since the heat transfer path is shorter, the heat dispersion is greater than in a case where the first layer 121 is a multilayer wire layer.

The mounting substrate 120 has a total of four wiring patterns. In the imaging unit 10 of the second embodiment, the first layer 121 is formed as a single layer in consideration of the heat dispersion characteristic, and therefore a corresponding amount of wiring patterns are layered on the second layer. As a result, the number of wiring patterns is asymmetric when centered on the core layer.

By causing the core layer 123 to be closer to the imaging chip 100, the number of thermal vias to be formed can be reduced. Accordingly, the configuration in which the core layer 123 is closer to the imaging chip 100 is advantageous with regard to the heat dispersion characteristic and also with regard to the cost and manufacturing process.

The following describes the resistance of the imaging unit 10 to liquid and gas (e.g. sulfur dioxide gas in the atmosphere). If liquid and gas were to enter within the imaging unit 10, the imaging capability of the imaging chip 100 would be reduced. Specifically, when liquid enters into the sealed space, the temperature difference relative to the outside of the sealed space causes condensation on the imaging chip 100 and the optical element 160. When there is condensation or mold resulting from condensation, the captured optical image becomes distorted, and therefore the quality of the output image is reduced. On the other hand, when gas enters into the sealed space, oxidation and corrosion of the circuits within the imaging chip 100 progresses, thereby incurring damage to the imaging chip 100.

With the imaging unit 10 of the second embodiment, the core layer 123 is a metal core. Metal has a greater ability than resin to block liquid and gas. The liquid and gas entering from the surface of the mounting substrate 120 facing away from the imaging chip 100 are blocked by the core layer 123. Accordingly, the water resistance and gas resistance can be increased.

Figure 9:
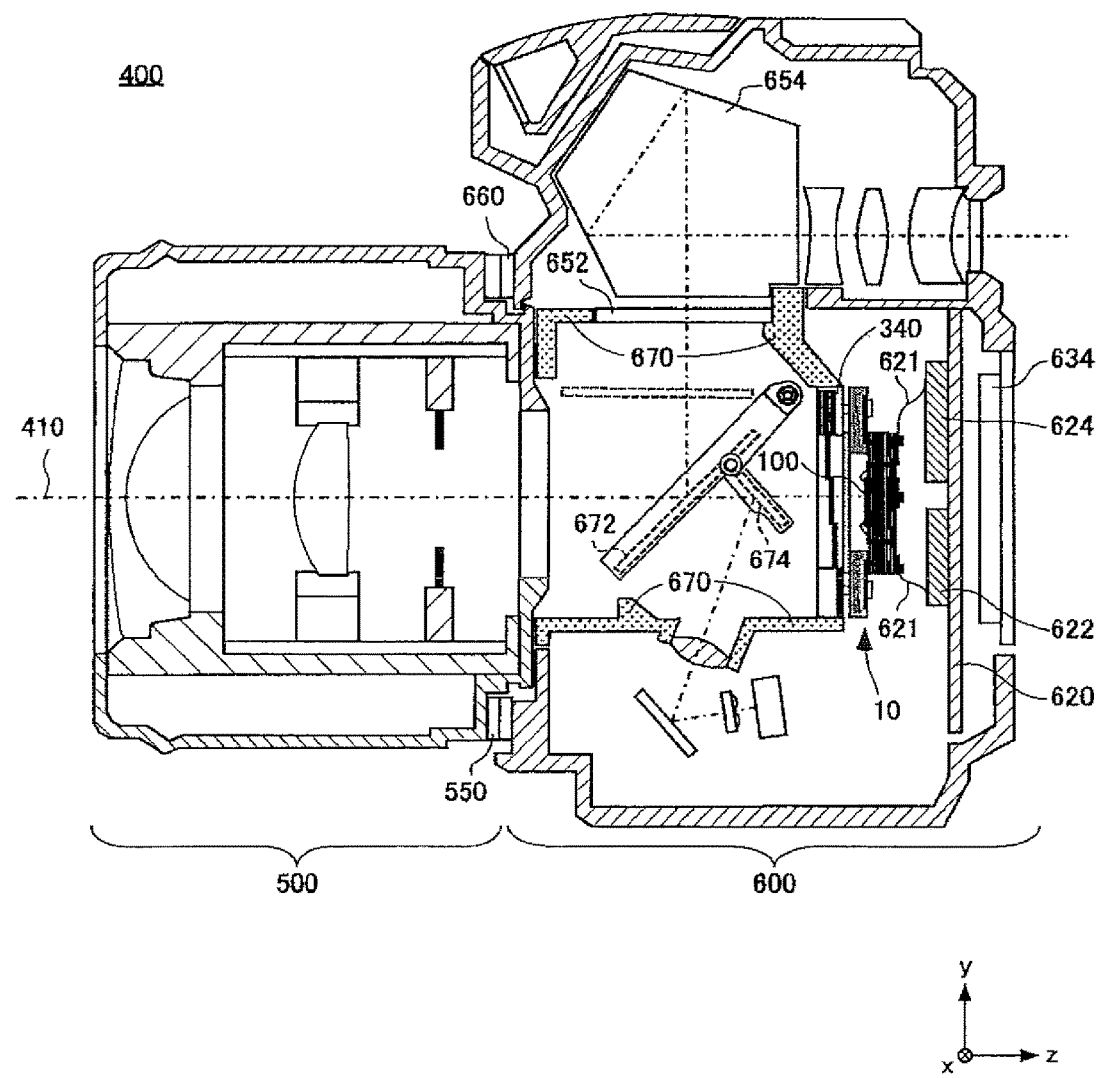
FIG. 9 is a schematic cross-sectional view of the camera 400.

FIG. 9 is a schematic cross-sectional view of the camera 400, which is an example of an imaging apparatus according to the second embodiment. The camera 400 includes a lens unit 500 and a camera body 600. The camera body 600 has a lens unit 500 attached thereto. The lens unit 500 includes an optical system arranged along an optical axis 410 within a lens barrel thereof, and guides incident subject light to the imaging unit 10 of the camera body 600.

The camera body 600 includes a main mirror 672 and a sub mirror 674 behind a body mount 660 connected to a lens mount 550. The main mirror 672 is axially supported to allow pivoting between an inclined position in which the main mirror 672 is inclined relative to the incident subject light from the lens unit 500 and a withdrawn position in which the main mirror 672 is withdrawn from the path of the subject light. The sub mirror 674 is axially supported to allow pivoting relative to the main mirror 672.

The focusing screen 652, the pentaprism 654, the main mirror 672, and the sub mirror 674 are supported by the mirror box 670 structure. In this way, the mirror box 670 is a structure to which a variety of other structures are attached and is centered in the camera 400. Therefore, the mirror box 670 is formed of a material with high rigid strength, such as metal. Since the heat of the imaging unit 10 is dispersed to the mirror box 670, the mirror box 670 is preferably made of a material with a high specific heat. As described above, the mirror box 670 is attached to the imaging unit 10 via the attachment hole 146. Since the imaging unit 10 is directly attached to the mirror box 670, the error in the relative positions of the mirror box 670 and the imaging chip 100 can be reduced. The mirror box 670 is a structure serving as a reference, and therefore can be strictly aligned with the optical axis. When the main mirror 672 and sub mirror 674 are withdrawn to the withdrawn position and the front and back curtains of the shutter unit 340 are opened, the subject light passing through the lens unit 500 reaches the light receiving surface of the imaging chip 100.

The body substrate 620 and the back surface display section 634 are arranged sequentially to the rear (positive z-axis direction) of the imaging unit 10. The back surface display section 634 that adopts a liquid crystal panel or the like is on the back surface of the camera body 600. The back surface display section 634 displays an image generated from the output signal from the imaging chip 100. The back surface display section 634 is arranged on the side of the core layer 123 opposite the imaging chip 100.

A CPU 622 and an electronic circuit such as an image processing ASIC 624 are provided on the body substrate 620. The output signal of the imaging chip 100 is transferred to the image processing ASIC 624, which is a processing chip for processing the output signal, via the flexible substrate 621. The image processing ASIC 624 is arranged on the side of the core layer 123 opposite the imaging chip 100.

The electronic circuit such as the image processing ASIC 624, a TFT driver, an actuator, and the like arranged behind the imaging unit 10 can be sources of noise. Since the core layer 123 is arranged between these noise sources and the imaging chip 100, the magnetic waves generated from these noise sources can be blocked by the core layer 123. Furthermore, the radiant heat from the electronic circuit such as the image processing ASIC 624 arranged behind the imaging unit 10 can be blocked.

Figure 10:
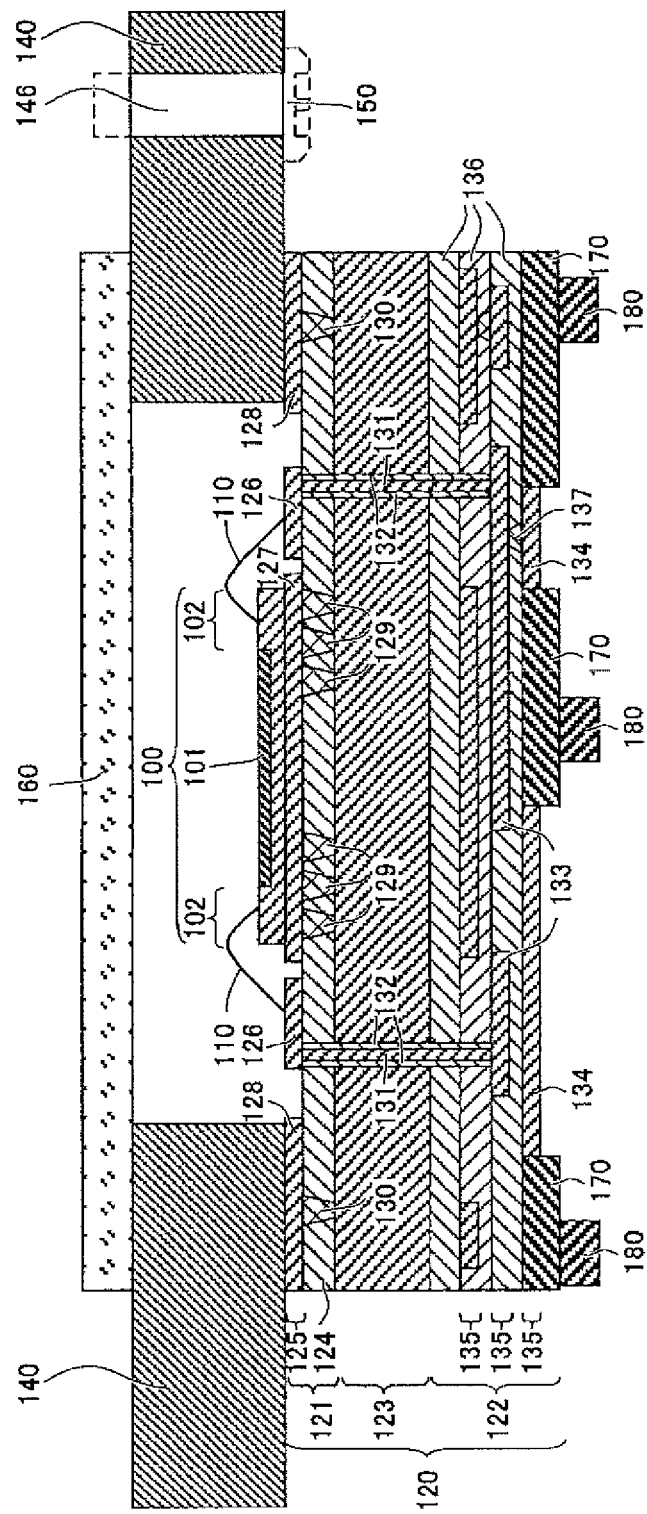
FIG. 10 is a schematic cross-sectional view of the imaging unit 20.

In the above description, the surrounding member 140 is formed of metal and has resin inserted therein, but the material of the surrounding member 140 is not limited to this. FIG. 10 is a schematic cross-sectional view of the imaging unit 20 according to a first modification. In FIG. 10, components having the same reference numerals as components in FIG. 8 have the same function and configuration as these components described in FIG. 8.

In the imaging unit 20, the surrounding member 140 is formed of a metal body. In this case, the heat dispersion can be increased more than in a case where the surrounding member 140 is formed of metal with resin inserted therein. In consideration of attaching the surrounding member 140 to other structures, the surrounding member 140 may be formed of a resin body that realizes the rigid strength needed for attachment to other structures. In this case, a space is maintained between the imaging chip 100 and the optical element 160, and the surrounding member 140 can be made lightweight.

Figure 11:
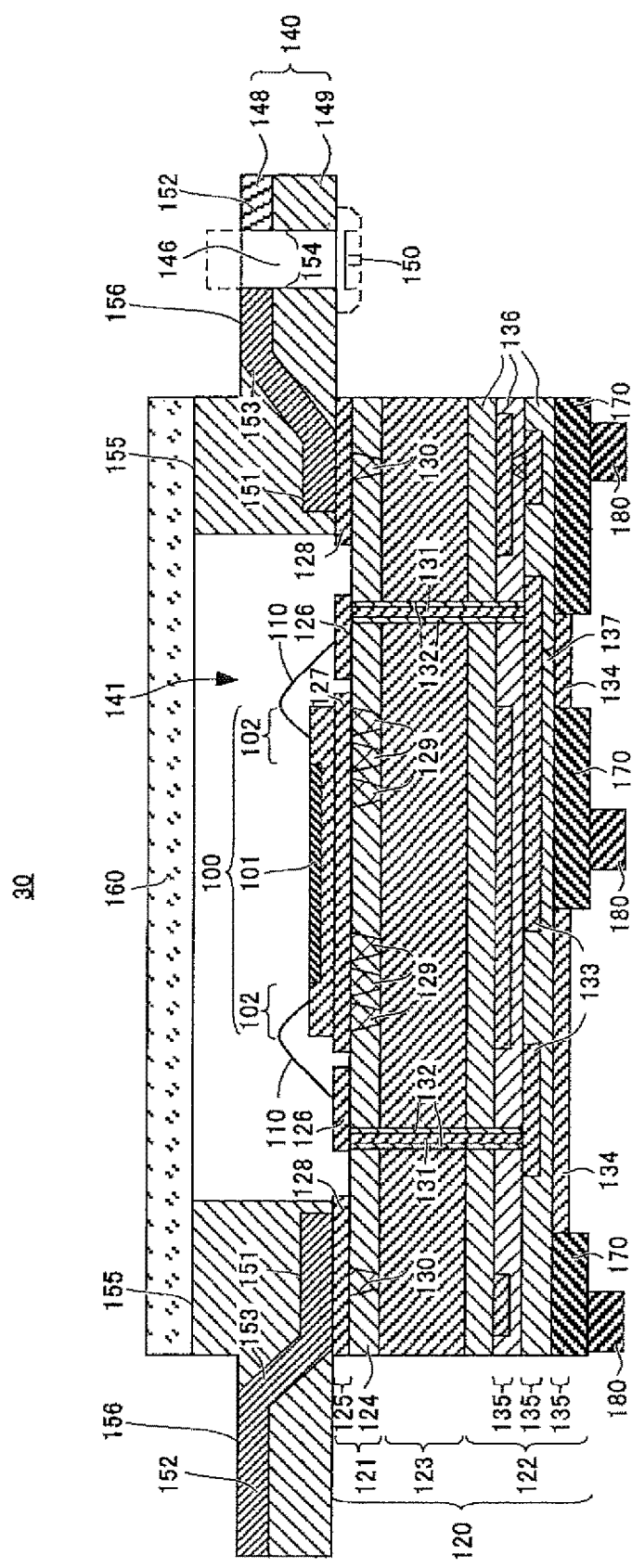
FIG. 11 is a schematic cross-sectional view of the imaging unit 30.

In the above description, the surrounding member 140 has a uniform thickness, but the surrounding member 140 is not limited to a uniform thickness as long as the rigid strength needed for attachment to other structures is realized. FIG. 11 is a schematic cross-sectional view of the imaging unit 30 according to a second modification. In FIG. 11, components having the same reference numerals as components in FIG. 8 have the same function and configuration as these components described in FIG. 8.

In the imaging unit 30, the thickness of the extending portion 156 that extends outward from the mounting substrate 120 and the optical element 160 of the surrounding member 140 is less than the thickness of the main body portion 155 sandwiched between the mounting substrate 120 and the optical element 160. As a result, the distance between the imaging chip 100 and the optical element 160 can be maintained and the surrounding member 140 can be made lightweight. The extending portion 156 can be formed by milling. On the other hand, if metal is used as the material for the surrounding member 140, the heat dispersion of the surrounding member 140 can be increased by setting the thickness of the extending portion 156 to be greater than the thickness of the main body portion 155. By setting the thickness of the extending portion 156 to be greater, the rigid strength of the surrounding member 140 can be increased.

Figure 12:
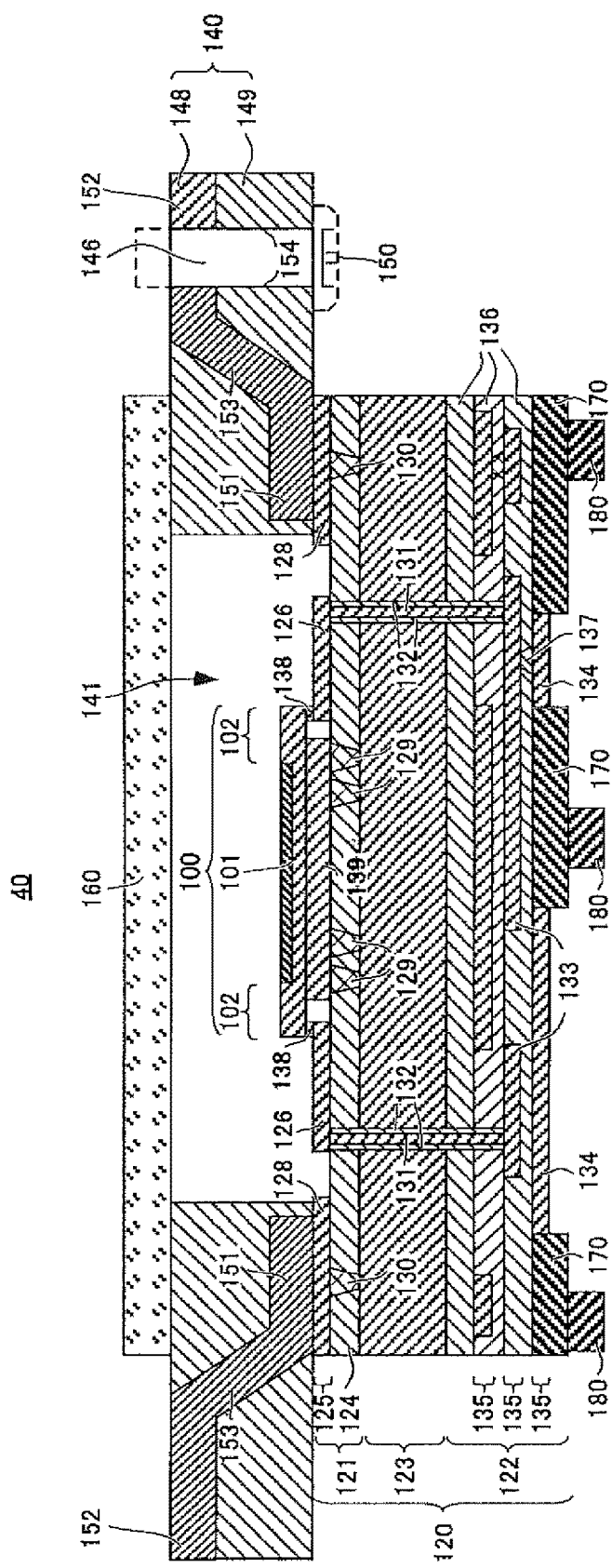
FIG. 12 is a schematic cross-sectional view of an imaging unit 40.

In the above description, the pixel signal of the imaging chip 100 is transmitted to the wire 126 via the bonding wire 110, but the method for transmitting the pixel signal is not limited to a method through the bonding wire 110. FIG. 12 is a schematic cross-sectional view of an imaging unit 40 according to a third modification. In FIG. 12, components having the same reference numerals as components in FIG. 8 have the same function and configuration as these components described in FIG. 8.

In the imaging unit 40, the imaging chip 100 is a back surface emission MOS image sensor. In the back surface emission MOS image sensor, the wire layer for transmitting the pixel signal is arranged on the mounting substrate 120 side of the pixels. Accordingly, the pixel signal can be retrieved from the surface of the imaging chip 100 on the mounting substrate 120 side. Here, the imaging chip 100 is electrically connected to the wire 126 by the bump 138. As a result, the pixel signal of the imaging chip can be transmitted to the mounting substrate 120.

When bonding the imaging chip 100 and the mounting substrate 120 using bumps, the arrangement position of the imaging chip 100 is distanced from the mounting substrate 120 by an amount equal to the height of the bumps 138. Accordingly, instead of forming the wire for heat dispersion as the wire of the wiring pattern on the bottom surface of the imaging chip 100, a separate heat sink 139 may be provided that fills the space between the imaging chip 100 and the mounting substrate 120. As a result, the heat of the imaging chip 100 can escape to the mounting substrate 120.

Figure 13:
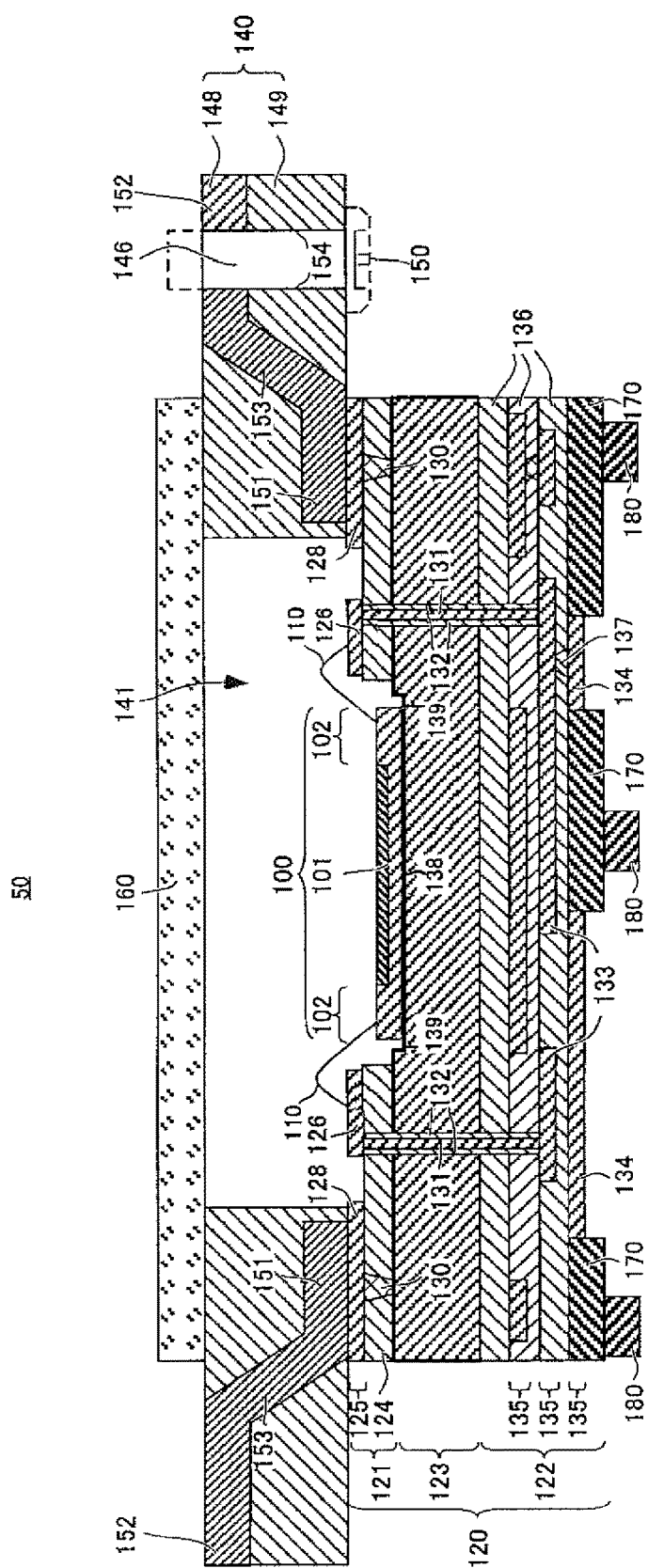
FIG. 13 is a schematic cross-sectional view of an imaging unit 50.

FIG. 13 is a schematic cross-sectional view of an imaging unit 50 according to a fourth modification. In FIG. 13, components having the same reference numerals as components in FIG. 8 have the same function and configuration as these components described in FIG. 8. The imaging unit 50 differs from the imaging unit 10 shown in FIG. 8 in that a recess 138 that houses at least a portion of the imaging chip 100 is formed in the core layer 123. The recess 138 is formed by a floor surface and an inner wall surface. The imaging chip 100 is mounted on the floor surface of the recess 138.

The recess 138 is formed by machining the core layer 123. The recess 138 is formed by milling, for example. By applying a machining process to the recess 138 in this manner, the flatness of the floor surface of the recess 138 can be improved. Furthermore, the levelness of the imaging chip 100 mounted on the floor surface of the recess 138 can be ensured.

In the structure where the imaging chip 100 is housed in the recess 138, the space between the side surface of the imaging chip 100 and the inner wall surface of the recess 138 may be filled with a resin material 139 having high thermal conductivity. As a result, the heat can be released from the side surface of the imaging chip 100 to the core layer 123 through the resin material 139.

By housing the imaging chip 100 in the recess 138, the space between the imaging chip 100 and the optical element 160 can be increased. Here, if debris or foreign material becomes stuck to the optical element 160 or the optical element 160 is damaged, there is a concern that such problems would be reflected in the captured image, but by increasing the distance between the imaging chip 100 and the optical element 160, the effect of this reflection can be reduced. Furthermore, since the imaging chip 100 is housed in the recess 138, the thickness of the surrounding member 140 can be reduced by a corresponding amount.

If the depth of the recess 138 is greater than the thickness of the imaging chip 100, the light receiving surface of the imaging chip 100 is lower than the plane of the opening of the recess 138. Therefore, the light that is incident from an inclined direction might not reach the peripheral portion of the imaging chip 100. In this case, the inner wall of the recess 138 is processed to have a taper, such that the light incident from an inclined direction reaches the imaging chip 100. Instead of the recess 138, the core layer 123 may have a protruding portion that is machined to be flat, and the imaging chip 100 may be mounted on the protruding portion. Instead of the recess 138, the core layer 123 may have an exposed surface that is exposed by forming an opening in the prepreg layer 124, and the imaging chip 100 may be mounted on the exposed surface.

A liquid crystal low-pass filter can be used as the optical element 160 of the imaging unit. If the liquid crystal low-pass filter is divided into a plurality of filters and arranged in the camera 400, one of these filters may be provided in place of the optical element 160.

A bending process can be applied to the end of the metal body 148 on the imaging chip 100 side. In this case, the end of the metal body 148 on the imaging chip 100 side has a portion that extends from the mounting substrate 120 side surface to the optical element 160 side surface. Accordingly, the rigid strength of the surrounding member 140 can be increased.

In the above description, the core layer 123 is formed over the entire primary surface direction of the mounting substrate 120, but it is only necessary that the core layer 123 be formed at least in a region corresponding to the imaging chip 100. If the core layer 123 is formed in the region corresponding to the imaging chip 100, the heat of the imaging chip 100 can reach the core layer 123 through the thermal vias 130. Furthermore, in consideration of the water resistance and gas resistance, it is not necessary to form the core layer 123, i.e. the metal layer with high rigid strength, on the mounting substrate 120, and it is only necessary to form a metal layer with any amount of rigid strength. The thickness of this metal layer may be the same as that of the wiring pattern 125 and the wiring pattern 135, for example. The metal layer may be formed as a multilayer structure. In this case, when the metal layer with the multilayer structure is projected onto the mounting surface of the imaging chip 100, the overall multilayer metal layer should cover the region surrounded by the surrounding member without leaving gaps. In this way, the overall metal layer with the multilayer structure can block the incursion of liquid and gas.

In the above description, the core layer 123 of the mounting substrate 120 is formed of metal, but in consideration of attaching the surrounding member 140 to other structures, the actual rigid strength of the mounting substrate 120 is not a problem, and therefore the core layer 123 may be formed of an insulating material such as resin. In other words, the core layer 123 may be a resin core. For example, FR4 can be used as the insulating material. In the same manner, in consideration of attaching the surrounding member 140 to other structures, the mounting substrate is not limited to being a core substrate, and may be an organic substrate or ceramic substrate. In the above description, it is only necessary that the surrounding member 140 have the rigid strength needed to enable attachment to other structures, and therefore there is a high degree of freedom when selecting the mounting substrate.

In the above description, the surrounding member 140 includes an attachment hole 146 as the attaching portion, but the attaching portion may be realized by a protrusion instead. In this case, by forming the protrusion using metal, heat can be efficiently released to the attached structure. The surrounding member 140 is directly attached to the other structure, but in consideration of heat dispersion, as long as the surrounding member 140 is thermally coupled to the other structure, the surrounding member 140 need not be directly attached to the other structure. Furthermore if an additional structure beyond the other structure is attached to the surrounding member 140, an additional attaching portion may be formed to attach this additional structure. In this case, a threading groove may be formed in this additional attachment hole. As a result, the strength of the connection when screwed together can be increased.

In the above description, the imaging chip 100 is mounted on the wire 127, but an opening may be formed in the center of the first layer 121 and the imaging chip 100 may be mounted directly on the core layer 123 exposed by the formation of the opening. In this case, the heat transfer path is formed as the contact surface where the imaging chip 100 contacts the core layer 123 without the first layer 121 interposed therebetween. Since the imaging chip 100 directly contacts the core layer 123, the dispersion of heat generated by the imaging chip 100 can be improved.

Figure 14A:
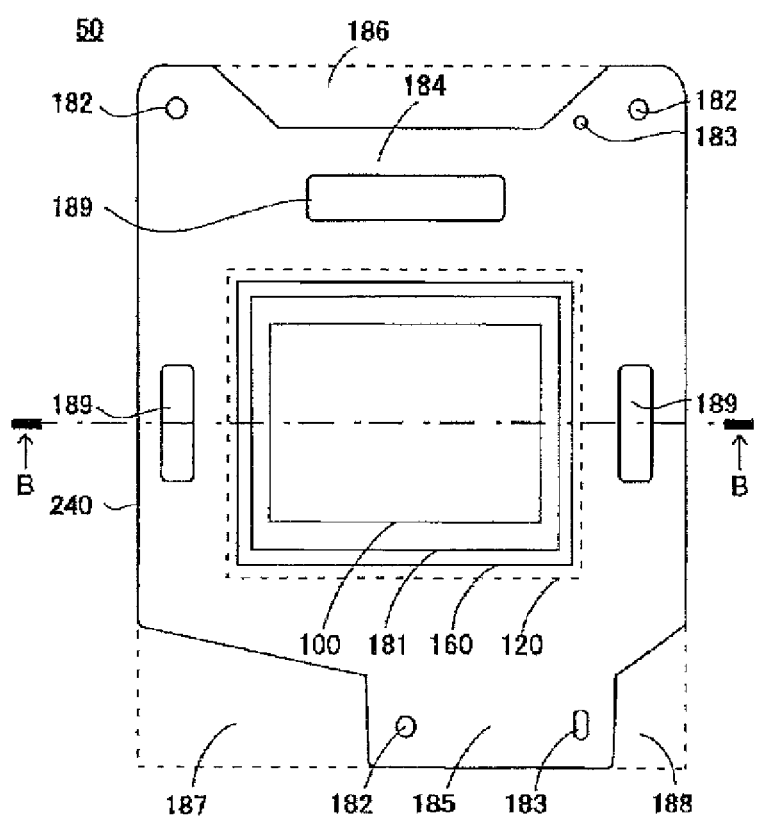
FIG. 14A is a view of the imaging unit as seen from the optical element side.
Figure 14B:
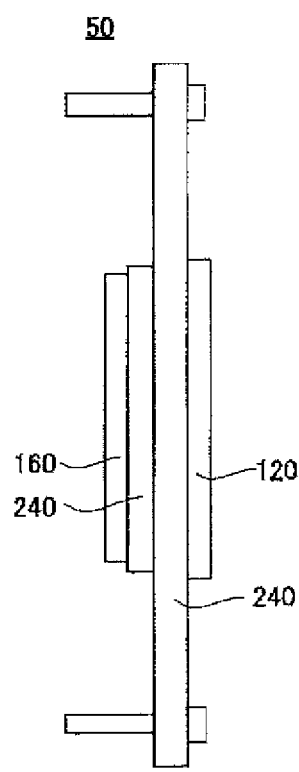
FIG. 14B is a side view of the imaging unit.
Figure 14C:
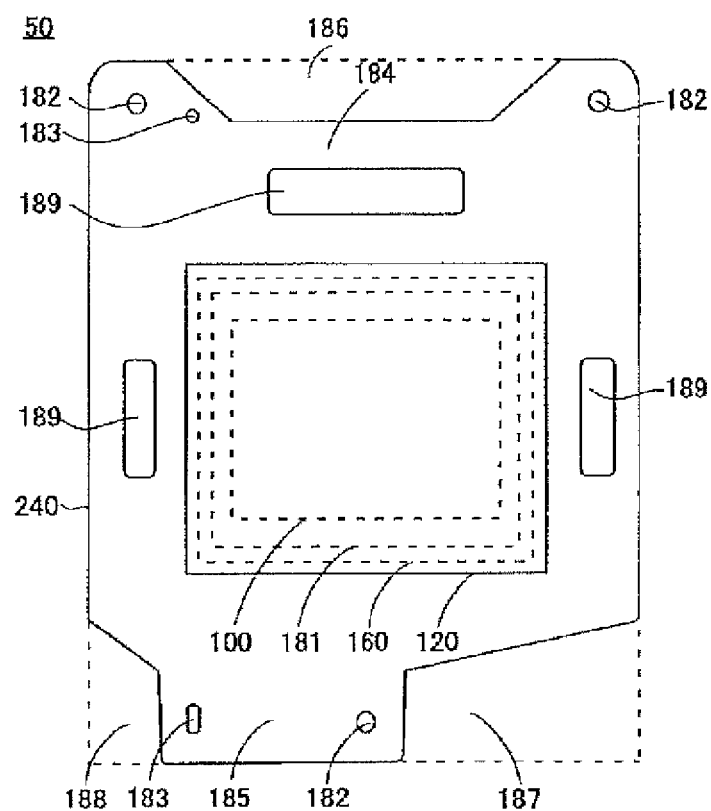
FIG. 14C is a view of the imaging unit as seen from the mounting substrate 120 side.
Figure 14D:
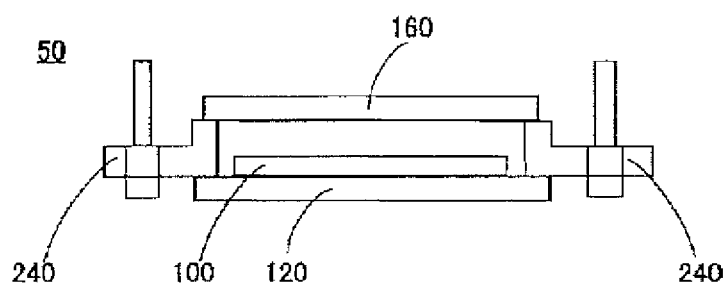
FIG. 14D is a schematic cross-sectional view of the imaging unit over the line B-B shown in FIG. 14A.

The following describes a variation of the shape of the surrounding member. FIGS. 14A to 14D are views for describing an exemplary shape of the surrounding member. In FIGS. 14A to 14D, components having the same reference numerals as components in FIG. 8 have the same function and configuration as these components described in FIG. 8. FIG. 14A is a view of the imaging unit 50 as seen from the optical element 160 side. FIG. 14B is a side view of the imaging unit 50. FIG. 14C is a view of the imaging unit 50 as seen from the mounting substrate 120 side. FIG.

14D is a schematic cross-sectional view of the imaging unit 50 over the line B-B shown in FIG. 14A. Since these drawings are intended to describe the shape of the surrounding member, the mounting substrate 120 is omitted from the drawings to simplify the description. Furthermore, in the imaging unit 50, the surface area of the mounting substrate 120 is slightly greater than the surface area of the optical element 160.

The overall surrounding member 240 has a rectangular shape with rounded corners and is long in the up and down direction in the plane of the drawing. The surrounding member 240 has an opening 181 in the center thereof. The imaging chip 100 is arranged in the opening 181 of the surrounding member 240. Cutout portions 186, 187, and 188 are formed in the overall rectangular shape of the surrounding member 240, in an upper region 184 and a lower region 185 that are regions at the top and bottom in the plane of the drawing between which the imaging chip 100 is sandwiched.

The cutout portion 186 is formed in the central portion of the top edge of the upper region 184. The cutout portions 187 and 188 are formed respectively at the left and right ends of the bottom edge of the lower region 185. The cutout portion 186 is provided to avoid the extending portion of the finder optical system. Accordingly, when the imaging unit 50 is mounted in the camera, the imaging unit 50 and the finder optical system do not interfere with each other. The cutout portion 187 is provided to avoid connectors and the like for connecting to an external battery. Accordingly, when the imaging unit 50 is mounted in the camera, the imaging unit 50 and the connectors for connecting to the external battery, for example, do not interfere with each other. The cutout portion 188 is provided to avoid an interface substrate provided with connectors for video signal output, for example. Accordingly, when the imaging unit 50 is mounted in the camera, the imaging unit 50 and the interface substrate do not interfere with each other. By forming the cutout portions 186, 187, and 188 corresponding to the structural components of the camera in this way, the imaging unit 50 can be arranged in the camera without interfering with other structural components. Furthermore, by forming the cutout portions 186, 187, and 188, the surrounding member 140 can be made lightweight.

The upper region 184 and the lower region 185 each have an attachment hole 182 as the attaching portion. Here, one attachment hole 182 is formed at each of the right and left ends at the top edge of the upper region 184, and one attachment hole 182 is formed in the central portion of the bottom edge of the lower region 185. More specifically, two attachment holes 182 are formed at respective ends of the cutout portion 186 to sandwich the cutout portion 186. The remaining one attachment hole 182 is formed in the region sandwiched by the cutout portion 187 and the cutout portion 188. In this way, three attachment holes 182 are formed with significant distance therebetween, and therefore the angle of attachment relative to the other structure can be accurately adjusted when attaching the imaging unit 50 to the other structure.

The upper region 184 and the lower region 185 each include a positioning hole 183. Here, one engaging hole is formed at the top end of the upper region 184 to serve as a positioning hole 183, and one oblong hole is formed at the bottom end of the lower region 185 to serve as a positioning hole 183. More specifically, the engaging hole is formed on a side portion of the cutout portion 186, and the oblong hole is formed in the region sandwiched by the cutout portion 187 and the cutout portion 188. In this way, the two positioning holes 183 are formed with a significant distance therebetween, and therefore the positioning accuracy can be increased.

The surrounding member 240 includes lightening portions 189 around the region where the imaging chip 100 is arranged. Here, the lightening portions 189 are respectively formed in the periphery at the top edge, the right edge, and the left edge of the imaging chip 100. In this way, the surrounding member 140 can be made lightweight.

An anti-reflection film may be formed on the inner wall surface of the opening 181 of the surrounding member 240. The anti-reflection film can be formed by applying a black color on the inner wall surface of the opening 181, for example.

In the above description, the cutout portion 187 is provided to avoid a connector to an external battery, for example, but the cutout portion 187 may instead be used in a soldered mounting space of the FPC. In other words, in this case, the cutout portion 187 is provided in order to ensure sufficient mounting space.

When the imaging unit is attached to the substrate on which is provided the image processing ASIC or the like behind the imaging unit, the accumulated error in the positioning of the imaging chip relative to the mirror box increases easily. However, with the imaging unit of the second embodiment, this problem is lessened.

Figure 15A:
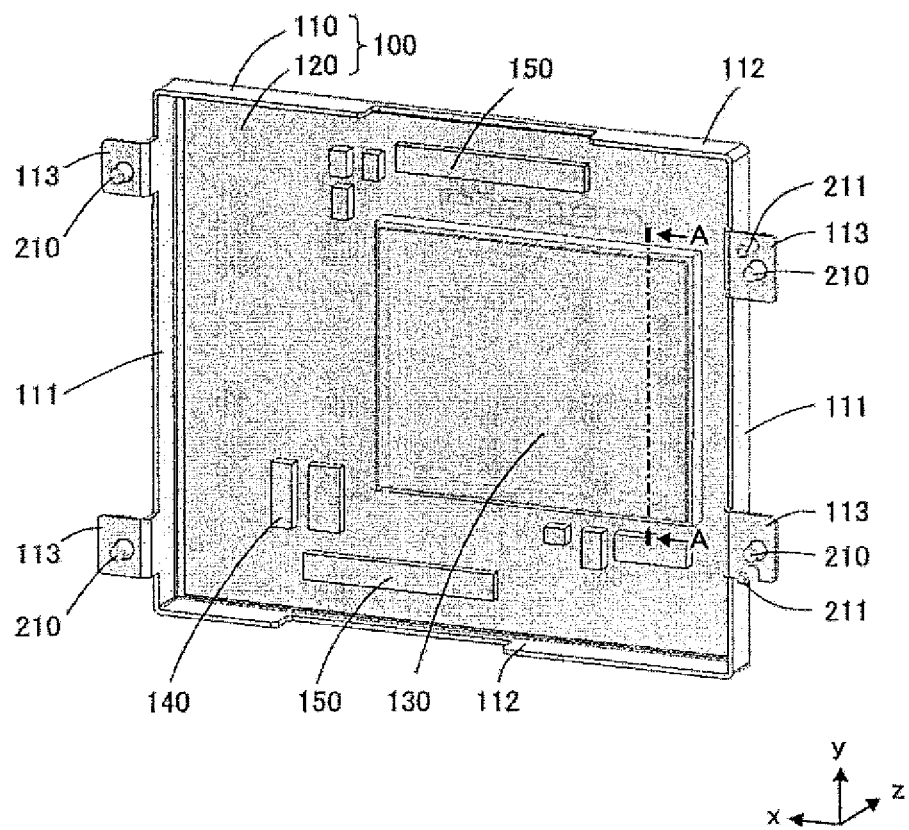
FIG. 15A is a perspective view of an imaging unit 300 including a structural substrate.

FIG. 15A is a perspective view of an imaging unit 300 including a structural substrate 100 as an example of the mounting substrate, according to a third embodiment. The structural substrate 100 is a metal core substrate that functions as a structure. The structural substrate 100 of the third embodiment has a metal layer 110 that functions as the core forming the metal core substrate and extends beyond the outer edge of the resin layer 120. The metal layer 110 is formed by metal such as copper, aluminum, or a nickel alloy, and has a thickness that realizes the desired rigid strength.

There could be a case in which imaging unit 300 of the third embodiment is adopted in a single lens reflex camera as an example of the electronic equipment, and the thickness of the metal layer 110 when used in the electronic equipment is preferably no less than 0.2 mm and less than 2.0 mm. By having this amount of thickness, the metal core substrate itself can function as the structure to which another structure is directly attached.

The circuit pattern is provided on the surface of the resin layer 120, and the imaging chip 130 that photoelectrically converts the incident subject light is mounted using COB mounting. COB mounting enables the mounted imaging chip 130 to be positioned more accurately on the structural substrate 100, serving as a structure, than conventional mounting in which the imaging chip 130 would be attached to the structure using screws, for example. Accordingly, when incorporating the imaging unit 300 in a single lens reflex camera, overlapping stacking of the structural substrate 100 can be decreased and assembly error of other structures relative to the imaging chip 130 can be restricted.

In the imaging unit 300 of the third embodiment, the direction in which the subject light is incident to the imaging chip 130 is set as the z-axis direction, the longitudinal direction of the imaging chip 130 is set as the x-axis direction, and the crosswise direction of the imaging chip 130 is set as the y-axis direction. In particular, the positive directions of the axes are shown in the drawings. In FIGS. 15B to 18, the coordinate axes are displayed using the coordinate axes of FIG. 15A as a standard, in order to understand the orientation in each drawing.

In addition to the imaging chip 130, various circuit elements 140, connectors 150, and the like are mounted on the surface of the resin layer 120. The connector 150 is connected to the flexible substrate, for example, and serves the role of transferring the output of the imaging chip 130 to the external processing circuit.

The structural substrate 100 according to the third embodiment is a multilayer substrate in which, in addition to the metal layer 110 serving as the core, metal layers serving as circuit patterns and resin layers serving as insulating layers are stacked in an alternating manner. For example, the circuit element 140 is connected to a circuit pattern of an inner layer through a via. The metal layer 110 serves as a ground. Accordingly, the metal layer 110 is connected to the ground line of the circuit pattern.

The metal layer 110 extending beyond the outer edge of the resin layer 120 has a curved portion in the extending portion, which is the extended location, and the curved portion causes the extending portion that curves in the mounting direction of the imaging chip to form a wall portion. The wall portion includes two vertical wall portions 111 that are parallel to the crosswise direction of the imaging chip 130 and two parallel wall portions 112 that are parallel to the longitudinal direction. In other words, the vertical wall portions 111 and the horizontal wall portions 112 are formed to surround the resin layer 120. Accordingly, stray light can be restricted from entering into the imaging chip 130 from the outside. Furthermore, external noise can be restricted. Each vertical wall portion 111 has additional partially curved portions at two locations, and the tip of each curved portion has an attaching portion 113. The attaching portions 113 are formed parallel to the flat portion on which the resin layer 120 is stacked.

The metal layer 110 including the vertical wall portions 111, the horizontal wall portions 112, and the attaching portions 113 is formed from metal using shearing or pressing. The structural substrate 100 is formed on the flat portion by alternately stacking the resin layer as the insulating layer and the metal layer as the circuit pattern. If the vertical wall portions 111 and horizontal wall portions 112 are formed by drawing, a box shape connecting the ends of these walls to each other can be formed. When this box shape is formed, the stray light from the outside can be further restricted.

The attaching portions 113 each have a hole for inserting a screw 210, and the other structures are screwed onto the structural substrate 100 through the attaching portions 113. The other structures can include the mirror box described further below, for example. The mirror box includes positioning pins 211 that protrude to the structural substrate 100 side. Some of the attaching portions 113 have positioning holes or the like corresponding to the positioning pins 211.

Figure 15B:
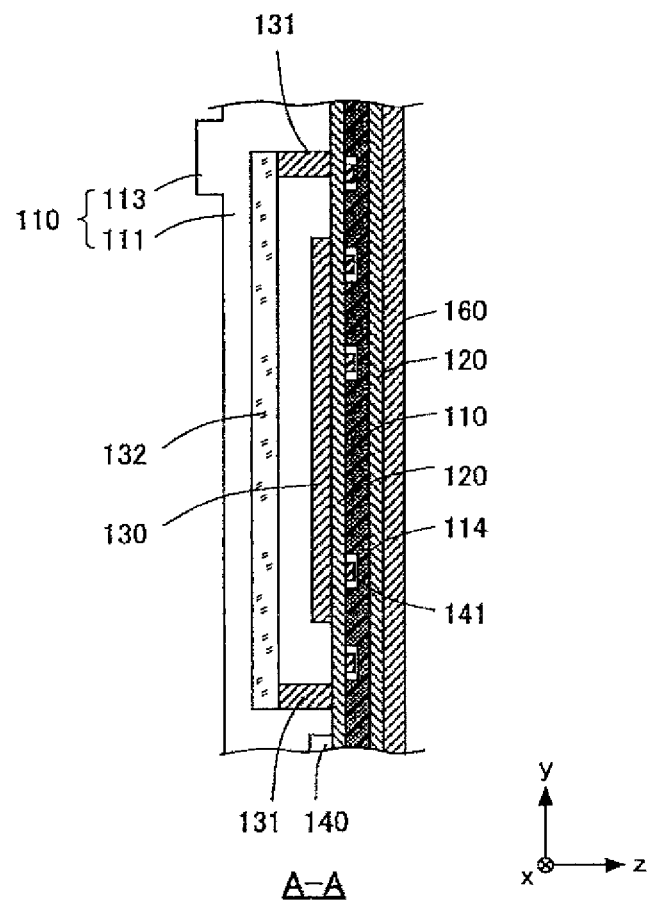
FIG. 15B is a cross-sectional view over the line A-A shown in FIG. 15A.

FIG. 15B is a cross-sectional view over the line A-A shown in FIG. 15A. As described above, the imaging chip 130 is COB-mounted on the circuit pattern provided on the surface of the resin layer 120. The metal layer forming the circuit pattern is a thin layer, and therefore is omitted from the drawings. Furthermore, the drawings show a resin layer 120 on which the imaging chip 130 is mounted and a resin layer 120 layered on the opposite side to sandwich the metal layer 110 as representative examples, but as described above, there may be more layers.

A housing space 114 for housing the internal circuit element 141 mounted on the resin layer 120 is formed in the metal layer 110. A thermal buffer board 160 is layered on the surface of the resin layer 120 that is stacked opposite the resin layer 120 on which the imaging chip 130 is mounted to sandwich the metal layer 110. The thermal buffer board 160 functions as a heat dispersion board, and is formed by a metal board that has undergone rough surface processing, for example.

The imaging chip 130 is surrounded by the surrounding member 131 serving as the surrounding member. The surrounding member 131 is fixed to the surface of the resin layer 120 and adhesively supports the optical element 132 facing the imaging chip 130. The imaging chip 130 is arranged in the sealed space surrounded by the resin layer 120, the surrounding member 131, and the optical element 132. Accordingly, the imaging chip 130 is protected from the incursion of dust, humidity, and harmful gas from the outside. An anti-reflection coating is applied to the surface of the surrounding member 131 and to the surface of the resin layer 120 facing the sealed space. The optical element 132 may be cover glass.

As described using FIG. 15A, the vertical wall portions 111 and the horizontal wall portions 112 are formed to surround the resin layer 120, and the height of the end surfaces of these wall portions (the distance in the negative z-axis direction) is greater than the height of the light receiving surface of the imaging chip 130, as shown in FIG. 15B. By setting the height in this manner, the stray light attempting to enter from the outside can be effectively blocked. If the height of the end surfaces of the wall portions is greater than the height of the optical element 132, as shown in FIG. 15B, then the stray light can be blocked more effectively.

Figure 16:
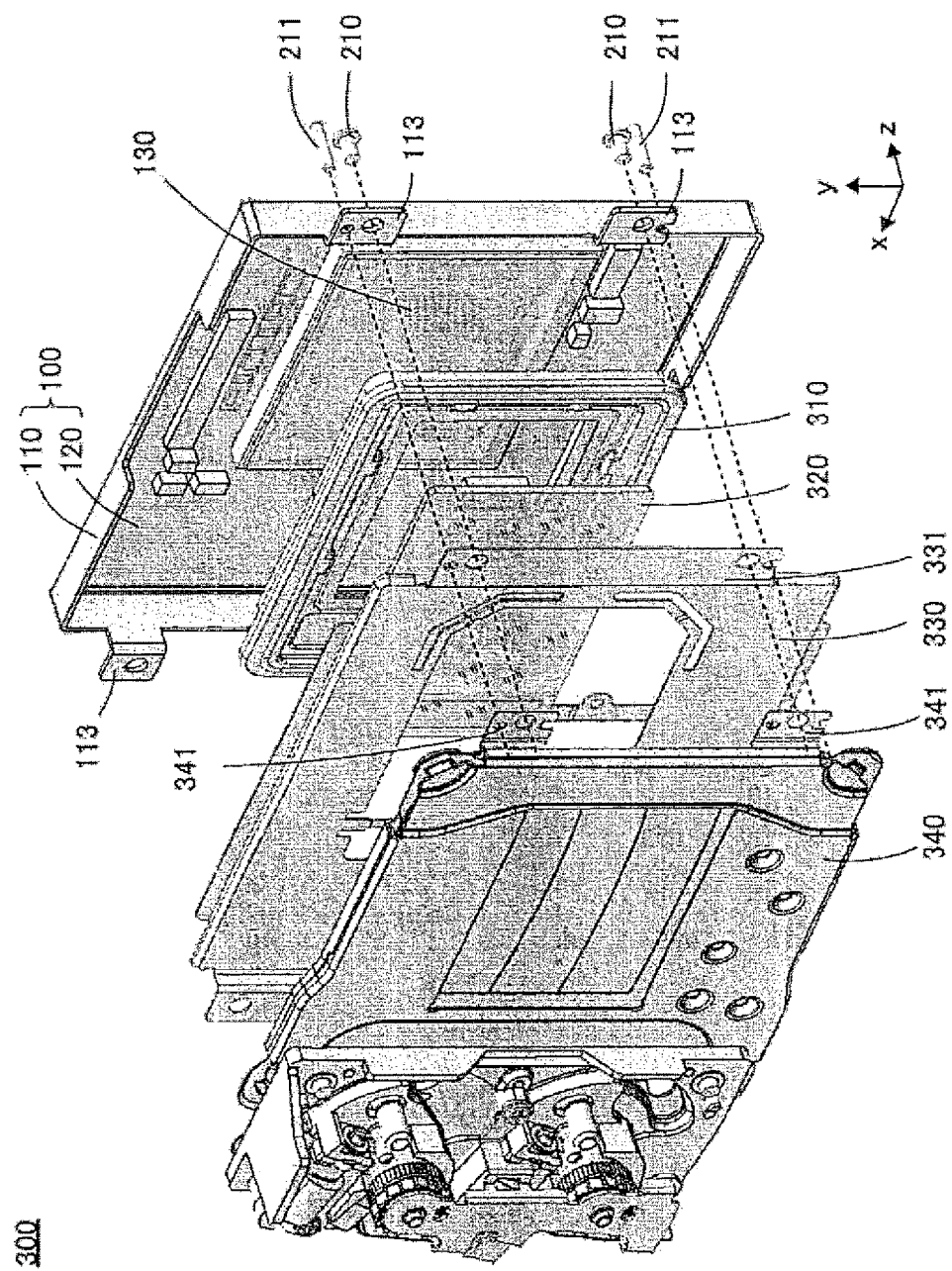
FIG. 16 is an exploded perspective view of the imaging unit including a shutter unit.

FIG. 16 is an exploded perspective view of the imaging unit 300 including a shutter unit 340. The shutter unit 340 is formed by a focal plane shutter made of a front curtain and a back curtain that can be in a spread state or a housed state, and a drive unit for driving the curtains.

The shutter unit 340 is attached to the attaching portion 113 of the structural substrate 100, in a manner to sandwich the mask rubber 310, the optical low-pass filter 320, and the pressing board 330 between itself and the imaging chip 130. Specifically, the shutter unit 340 and the pressing board 330 respectively include attaching portions 341 and 331 that are the same as the attaching portion 113 of the structural substrate 100. The screws 210 penetrating through the holes provided in the attaching portions 341 and 331 and through the holes provided in the attaching portion 113 cause the imaging unit 300 to be formed integrally. The attaching portions 341 and 331 include positioning holes that are the same as those of the attaching portion 113, and the shutter unit 340 and pressing board 330 can be positioned accurately relative to the other structure, e.g. the mirror box, by the positioning pins 211.

The focal plane shutter generates static electricity due to the curtain travelling. Static electricity not only impedes smooth curtain travelling, but also causes a noise component to be mixed with the output of the imaging chip 130. Therefore, in order to cause the generated static electricity to escape, the focal plane shutter is electrically connected to the metal layer 110. Specifically, the attaching portion 341 of the shutter unit 340 is formed of metal and is connected to a linking mechanism of the focal plane shutter. By using the metal screws 210, the attaching portion 341 is electrically connected to the attaching portion 113, which is a portion of the metal layer 110. In this case, the attaching portion 341 functions as a connection portion through which the static electricity escapes. The connection portion may be provided at another location on the metal layer 110.

Figure 17A:
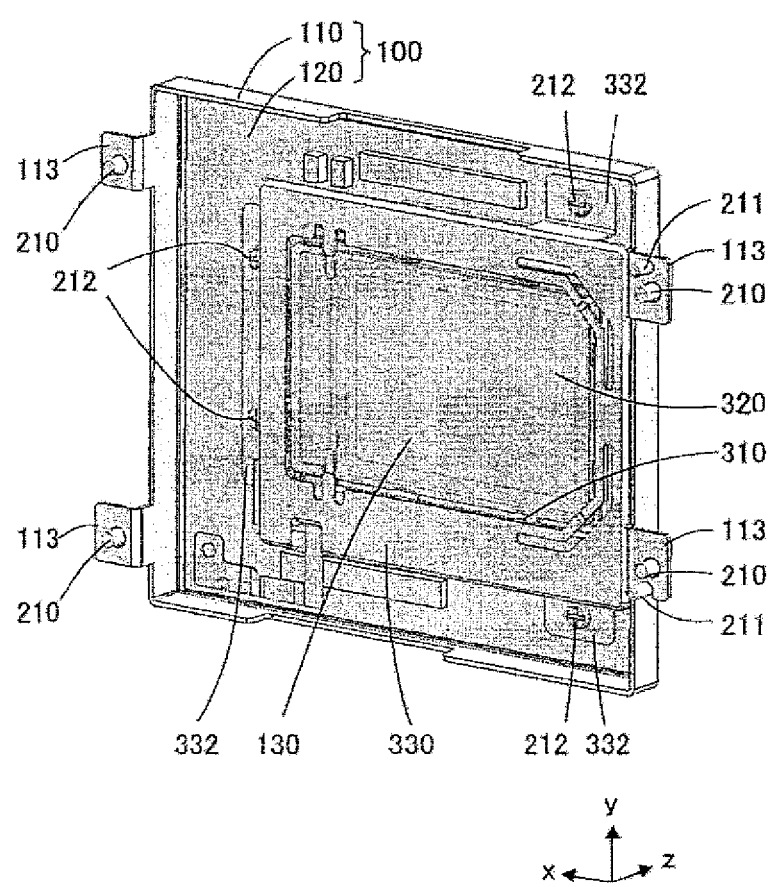
FIG. 17A is a perspective view of a portion of the imaging unit 300 including another exemplary structural substrate as seen from the direction of the imaging chip.
Figure 17B:
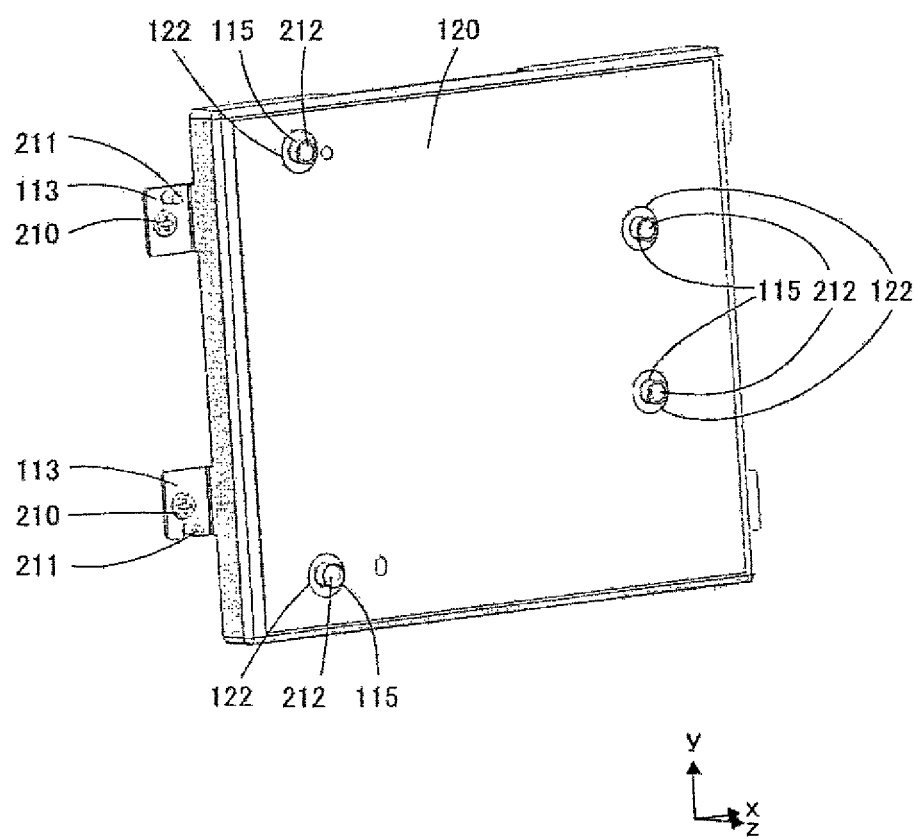
FIG. 17B is a perspective view of a portion of the imaging unit 300 including another exemplary structural substrate as seen from the opposite side.

FIGS. 17A and 17B are perspective views showing a portion of the imaging unit 300 including another exemplary structural substrate 100 according to the third embodiment.

In particular, FIG. 17A is a perspective view as seen from the direction of the imaging chip 130, and FIG. 17B is a perspective view as seen from the opposite side. The following description focuses on the differences relative to the third embodiment described further above.

The imaging unit 300 according to the embodiment described using FIG. 16 has a configuration in which the pressing board 330 is bound together with the shutter unit 340. In the imaging unit 300 shown in FIG. 17, the pressing board 330 is fixed to the structural substrate 100 independently from the shutter unit 340. Specifically, instead of the attaching portion 331 shown in FIG. 16, the pressing board 330 includes an attaching portion 332 for attachment to the resin layer 120 side.

The resin layer 120 stacked on the metal layer 110 has an escape hole 122 corresponding to the screw hole of the attaching portion 332. The metal layer 110 includes screw receivers 115 that protrude toward the back surface, as shown in FIG. 17B. The screws 212 are screwed into the screw receivers 115 from the attaching portion 332 side, to fix the pressing board 330 to the structural substrate 100. At this time, the mask rubber 310 and the optical low-pass filter 320 are also sandwiched and fixed to the structural substrate 100. In other words, the screw receivers 115 are provided on the inside of the outer edge of the resin layer 120, and serve as fixing portions that fix the optical low-pass filter 320, the mask rubber 310, and the pressing board 330, which are the structures positioned in the space sandwiched by the shutter unit 340 and the structural substrate 100. With this configuration, for example, an oscillating element adhered to the optical low-pass filter 320 can be easily connected to the circuit pattern on the resin layer 120.

Figure 18:
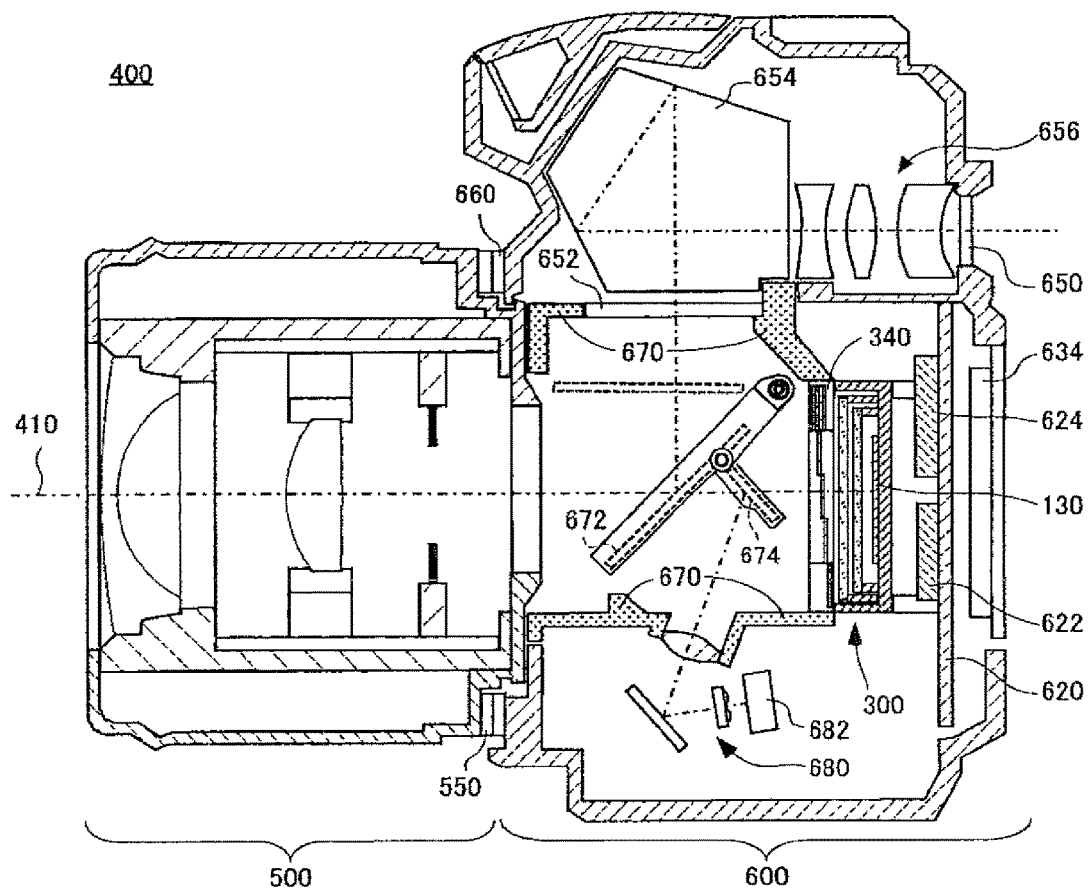
FIG. 18 is a cross-sectional view of a single lens reflect camera that includes the imaging unit

FIG. 18 is a cross-sectional view of a single lens reflex camera 400 that includes the imaging unit 300. The single lens reflect camera 400 includes the lens unit 500 and the camera body 600. The lens unit 500 is attached to the camera body 600. The lens unit 500 includes an optical system arranged along an optical axis 410 within a lens barrel thereof, and guides incident subject light to an imaging chip 104 provided in the imaging unit 300 of the camera body 600.

The camera body 600 includes a main mirror 672 and a sub mirror 674 behind a body mount 660 connected to a lens mount 550. The main mirror 672 is axially supported to allow pivoting between an inclined position in which the main mirror 672 is inclined relative to the incident subject light from the lens unit 500 and a withdrawn position in which the main mirror 672 is withdrawn from the path of the subject light. The sub mirror 674 is axially supported to allow pivoting relative to the main mirror 672.

When the main mirror 672 is in the inclined position, the majority of incident subject light passing through the lens unit 500 is reflected by the main mirror 672 and guided to a focusing screen 652. The focusing screen 652 is arranged at a position conjugate to the light receiving surface of the imaging chip 130, and causes the subject light formed by the optical system of the lens unit 500 to be visible. The subject image formed by the focusing screen 652 can be observed from a finder 650 through a pentaprism 654 and a finder optical system 656. A portion of the subject light incident to the main mirror 672 in the inclined position passes through a half-mirror region of the main mirror 672 to be incident to the sub mirror 674. The sub mirror 674 reflects the portion of incident light from the half-mirror region toward a focusing optical system 680. The focusing optical system 680 guides a portion of the incident light to a focal point detection sensor 682.

The focusing screen 652, the pentaprism 654, the main mirror 672, and the sub mirror 674 are supported by the mirror box 670 structure. As described above, the mirror box 670 is attached to the imaging unit 300 via the attaching portion 113. When the main mirror 672 and sub mirror 674 are withdrawn to the withdrawn position and the front and back curtains of the shutter unit 340 are opened, the subject light passing through the lens unit 500 reaches the light receiving surface of the imaging chip 130.

The body substrate 620 and the back surface display section 634 are arranged sequentially to the rear (positive z-axis direction) of the imaging unit 300. The back surface display section 634 that adopts a liquid crystal panel or the like is on the back surface of the camera body 600. A CPU 622 and an electronic circuit such as an image processing ASIC 624 are provided on the body substrate 620. The output signal of the imaging chip 130 is transferred to the image processing ASIC 624 via the flexible substrate.

In the third embodiment described above, the structural substrate 100 is a multilayer substrate, but the structural substrate 100 may instead be a single layer substrate. Furthermore, the above describes an example in which the structural substrate 100 is attached to the mirror box 670 by the attaching portion 113, but the present invention is not limited to this, and the structural substrate 100 may be attached to a display unit that includes a back surface display section 634, for example. Instead, the structural substrate 100 may be connected to a display unit along with the mirror box 670.

In the third embodiment, the resin layer 120 is stacked on the flat portion of the metal layer 110, and the extending portion is the exposed metal layer 110. However, as another example, a sufficient region may be provided for the extending portion at the tip of the curved portion and the resin layer and metal layer may be stacked independently in this region, such that a metal core substrate is formed that is separate from the metal core substrate stacked on the flat portion. In other words, the metal layer 110 serving as the core can be shared to form a multilayer substrate in which the resin layer and circuit pattern are stacked in a plurality of regions. For example, an independent multilayer substrate can be provided with a drive circuit that drives the focal plane shutter. With this configuration, space can be conserved and the electrical interference between the components can be restricted at the same time.

The third embodiment describes an example in which the imaging apparatus is a single lens reflex camera 400, but the camera body 600 may instead be the imaging apparatus. The imaging apparatus is not limited to a camera with an exchangeable lens having a mirror unit, and may instead be a camera having an integrated lens with or without a mirror unit or a camera having an exchangeable lens without a mirror unit. Furthermore, the structural substrate 100 is not limited to being implemented in an imaging apparatus, and can be implemented in a variety of electronic devices.

The following describes characteristic features of the third embodiment. The structural substrate has an extending portion where at least one of the metal layers in the metal core substrate formed by stacking the metal layers and the resin layers extends beyond the outer edge of the resin layer, and an attaching portion for attaching another structure is formed on this extending portion. The structural substrate has a curved portion in the extending portion. The curved portion causes the extending portion that curves in the mounting direction of the imaging chip to form an end surface of a wall portion, which is higher than the light receiving surface of the shutter unit. Furthermore, a connection portion is included in the metal layer having the extending portion, and the static electricity generated when the shutter unit operates escapes through the connection portion. The metal layer having the extending portion has a fixing portion that fixes a structure positioned in the space between the structural substrate and the shutter unit to the inside of the outer edge. The structural substrate has another metal core substrate formed by stacking resin layers and metal layers on the extending portion, independently from the resin layers and metal layers forming the metal core substrate.

In the second embodiment, the surrounding member has an attaching portion for attaching another structure. In the imaging unit of the third embodiment, the mounting substrate has an attaching portion for attaching another structure. The attaching portion for attaching another structure may be provided on both the surrounding member and the mounting substrate.

The following describes the fourth embodiment with reference to the diagrams, but the present invention is not limited to this. In the description of the fourth embodiment, the orthogonal axes X, Y, and Z are set in a suitable manner and referenced to describe the position relationship of the components.

Figure 19:
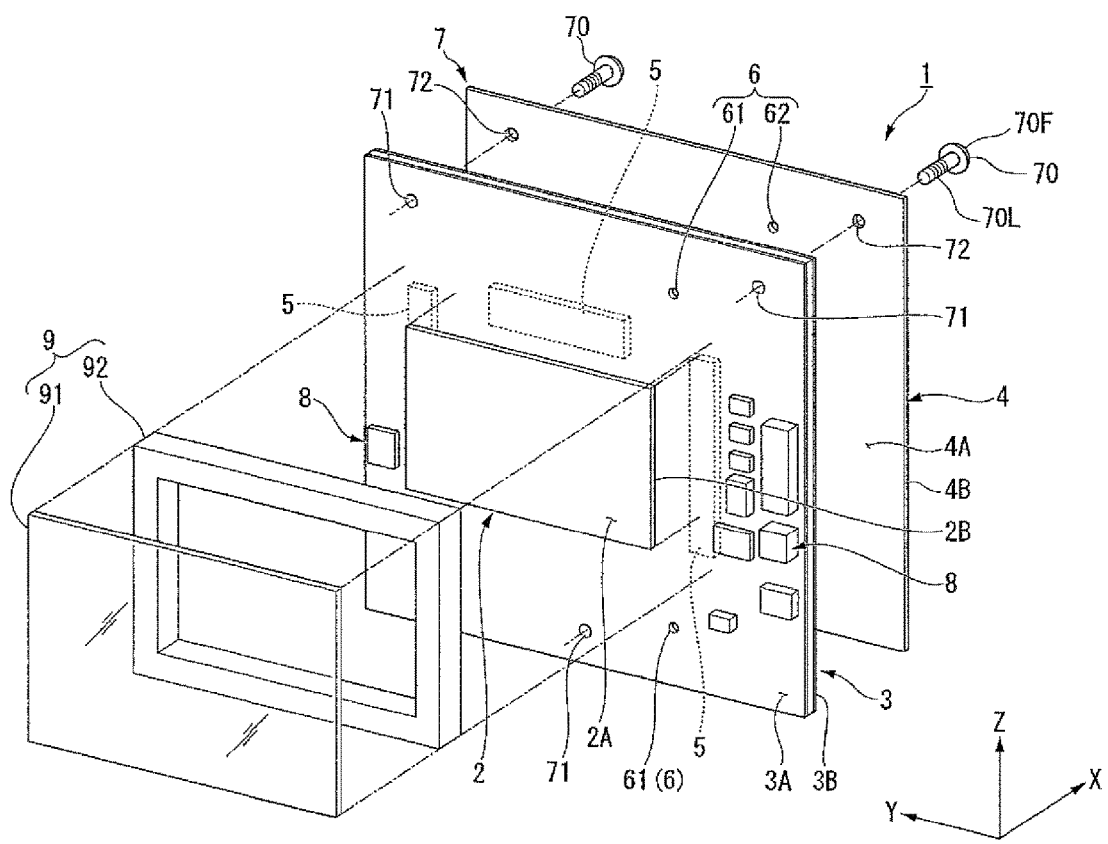
FIG. 19 is an exploded perspective view of an exemplary imaging apparatus according to the fourth embodiment.
Figure 20:
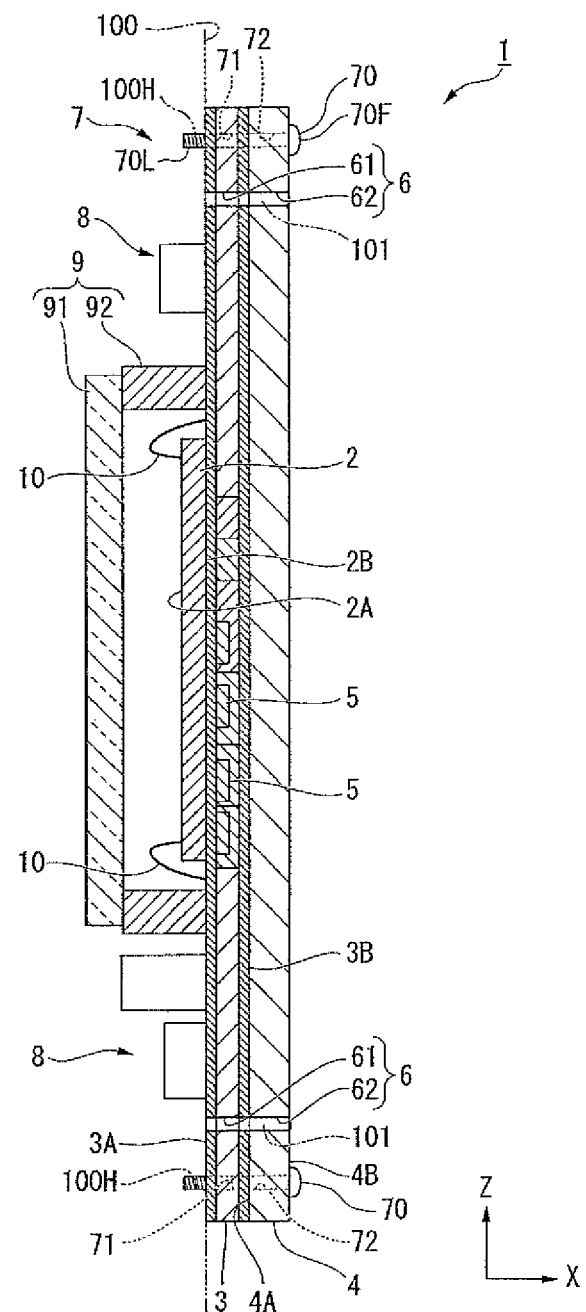
FIG. 20 is a cross-sectional view of the imaging apparatus according to the fourth embodiment.

FIG. 19 is an exploded perspective view of an exemplary imaging apparatus 1 according to the fourth embodiment, and FIG. 20 is a cross-sectional view of this imaging apparatus 1. In FIGS. 19 and 20, the imaging apparatus 1 includes an imaging chip 2 and a mounting substrate 3 on which the imaging chip 2 is mounted.

The imaging chip 2 includes an imaging sensor (semiconductor image sensor). The imaging sensor includes a solid imaging element. The imaging sensor includes a CCD image sensor. The imaging sensor may include a CMOS image sensor.

In the fourth embodiment, the mounting substrate 3 is a circuit board having a metal layer. The circuit board includes a printed circuit board, for example. A metal core multilayer printed circuit board (referred to as a metal core substrate) is one example of the circuit board having a metal layer, and this feature is the most concrete implementation. The mounting substrate 3 may include the circuit board having the metal layer and another board in addition to this circuit board. For example, the mounting substrate 3 may include the circuit board having the metal layer and a support board that supports the circuit board having the metal layer.

The imaging chip 2 has a front surface 2A and a back surface 2B that faces the opposite direction of the front surface 2A. The mounting substrate 3 has a front surface 3A and a back surface 3B that faces the opposite direction of the front surface 3A. The imaging chip 2 is arranged facing the front surface 3A of the mounting substrate 3. The back surface 2B of the imaging chip 2 faces the front surface 3A of the mounting substrate 3.

The front surface 2A of the imaging chip 2 has an incident surface to which the light from an object (subject) is incident. The imaging chip 2 includes an optical element (lens) to which the light from the subject is incident, a color filter to which the light from the optical element is incident, and a photoelectric conversion element (photodiode) to which the light from the color filter is incident.

As shown in FIG. 20, the imaging chip 2 is electrically connected to the mounting substrate 3 via the connection member 10. In the fourth embodiment, the connection member 10 includes a wire. The imaging chip 2 is electrically connected to the mounting substrate 3 via a wire. In other words, in the fourth embodiment, the imaging chip 2 is mounted on the mounting substrate 3 using wire bonding.

The wires are metal wires. The wires may be formed of gold (Au) or aluminum (Al). In a case of wire bonding, a pad arranged on the imaging chip 2 and a pad arranged on the mounting substrate 3 are electrically connected to each other by a wire.

Figure 21:
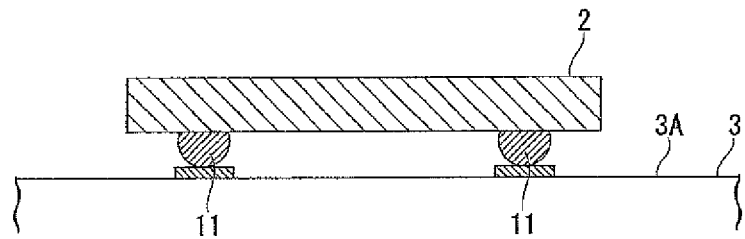
FIG. 21 is a view of the imaging apparatus according to the fourth embodiment.

The imaging chip 2 may be electrically connected to the mounting substrate 3 via the connection member 11 such as shown in FIG. 21. In FIG. 21, the connection member 11 includes a protruding electrode, referred to as a "bump." The imaging chip 2 is electrically connected to the mounting substrate 3 via the protruding electrode. In other words, the imaging chip 2 may be mounted on the mounting substrate 3 using flip chip mounting. In a case of flip chip mounting, a terminal arranged on the imaging chip 2 and a terminal arranged on the mounting substrate 3 are electrically connected to each other via the protruding electrode.

Figure 22:
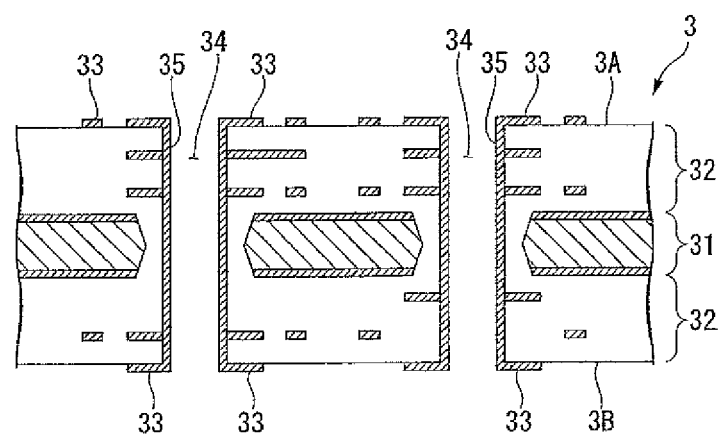
FIG. 22 is a cross-sectional view of an exemplary mounting substrate according to the fourth embodiment.

FIG. 22 is a cross-sectional view of an exemplary mounting substrate 3. As shown in FIG. 22, the mounting substrate 3 includes a circuit board that has a metal layer, a metal layer 31, and an insulating layer 32. The mounting substrate 3 includes an outer layer circuit 33 and a through-hole 34. The metal layer 31 is referred to as a base metal layer or a metal core layer. The metal layer 31 may be formed of copper (Cu) or aluminum (Al), for example. The insulating layer 32 is formed of a composite resin. The insulating layer 32 may include an inorganic filler. The metal film 35 is formed within the through-hole 34 using a plating technique.

In the example shown in FIG. 22, the insulating layer 32 is arranged on both sides of the metal layer 31. At least a portion of the front surface 3A and at least a portion of the back surface 3B of the mounting substrate 3 include a surface of the insulating layer 32.

Figure 23:
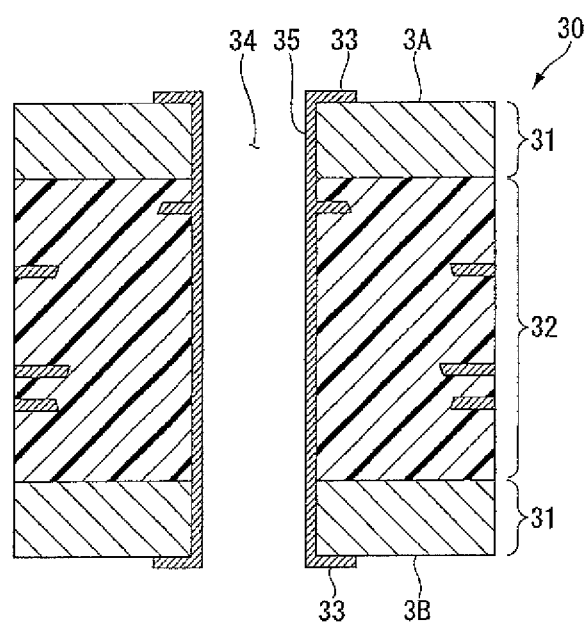
FIG. 23 is a cross-sectional view of an exemplary mounting substrate according to the fourth embodiment.

As shown in FIG. 23, the mounting substrate 30 may include the insulating layer 32 and the metal layer 31 arranged on both sides of the insulating layer 32. In the example of FIG. 23, at least a portion of the front surface 3A and at least a portion of the back surface 3B of the mounting substrate 30 includes a surface of the metal layer 31.

As shown in FIGS. 19 and 20, in the fourth embodiment, the imaging apparatus 1 includes an electronic component 5 arranged within the mounting substrate 3. In other words, in the fourth embodiment, the electronic component 5 is housed within the mounting substrate 3.

In the fourth embodiment, the electronic component 5 includes a signal processing circuit, for example. The electronic component 5 may include passive elements such as resistors, capacitors, and inductors. The electronic component 5 may include active elements such as integrated circuits, and transistors. The electronic component 5 may include a regulator. The electronic component 5 may include an A/D converter that converts the analog signal from the imaging sensor into a digital signal.

As shown in FIG. 20, the electronic component 5 may be arranged facing the back surface 2B of the imaging chip 2. As shown in FIG. 19, the electronic component 5 may be arranged around at least a portion of the imaging chip 2. In other words, the electronic component 5 may be arranged on the mounting substrate 3 in a manner to not face the imaging chip 2.

In the fourth embodiment, the imaging apparatus 1 includes an electronic component 8 that is arranged on the front surface 3A of the mounting substrate 3. The electronic component 8 is arranged around at least a portion of the imaging chip 2.

In the fourth embodiment, the electronic component 5 need not be arranged within the mounting substrate 3. In the fourth embodiment, the electronic component 8 need not be arranged on the front surface 3A.

As shown in FIGS. 19 and 20, in the fourth embodiment, the imaging apparatus 1 includes a restricting member 4 that is arranged facing the back surface 3B of the mounting substrate 3 to restrict the temperature change of the imaging chip 2. The restricting member 4 is plate-shaped and has a front surface 4A that faces the back surface 3B of the mounting substrate 3 and a back surface 4B that faces the opposite direction of the front surface 4A. In the fourth embodiment, the back surface 3B of the mounting substrate 3 and the front surface 4A of the restricting member 4 contact each other. At least a portion of the back surface 3B and the front surface 4A may be separated from each other. In the fourth embodiment, the outer shape of the mounting substrate 3 and the outer shape of the restricting member 4 are substantially the same. Instead, the restricting member 4 may be smaller or larger than the outer shape of the mounting substrate 3. A plurality of restricting members 4 may be arranged on the mounting substrate 3. In other words, the plurality of restricting members 4 may be arranged to face a plurality of regions on the back surface 3B of the mounting substrate 3. The restricting member 4 is block-shaped. In other words, the dimensions of the restricting member 4 in the X-axis direction may be greater than the dimensions of the restricting member 4 in the Y-axis direction and Z-axis direction.

In the fourth embodiment, the restricting member 4 is formed of copper (Cu). The restricting member 4 may instead be formed of aluminum (Al) or a nickel alloy. The nickel alloy may include a 42 alloy, for example.

In the fourth embodiment, the restricting member 4 functions as a heat sink that disperses the heat of the imaging chip 2. The heat generated by the imaging chip 2 is released from the restricting member 4 through the mounting substrate 3. Therefore, when the imaging chip 2 operates, temperature increase of the imaging chip 2 is restricted. The restricting member 4 can also disperse the heat of the electronic components 5 and 8, for example.

The restricting member 4 restricts the heat on the front surface 4A side from reaching the back surface 4B side. Furthermore, the restricting member 4 restricts the heat on the back surface 4B side from reaching the front surface 4A side. For example, the restricting member 4 restricts the heat of the imaging chip 2 (or the electronic components 5 and 8, etc.) from reaching the space that the back surface 4B faces. In this way, even when the imaging chip 2 (or the electronic components 8 and 5, etc.) formed on the front surface 4A side generates heat, temperature change (temperature increase) of the components arranged in the space that the back surface 4B faces (e.g. the electric circuits or control circuits) is restricted.

Furthermore, the restricting member 4 restricts the heat of the components arranged in the space that the back surface 4B faces (e.g. the electric circuits or control circuits) from reaching the imaging chip 2 (or the electronic components 5 and 8, etc.) formed on the front surface 4A side. As a result, even when the components arranged in the space that the back surface 4B faces (e.g. the electric circuits or control circuits) generate heat, temperature change (temperature increase) of the imaging chip 2 (or the electronic components 5 and 8, etc.) formed on the front surface 4A side is restricted.

The restricting member 4 may be omitted. For example, the heat of the imaging chip 2 (or the electronic components 5 and 8, etc.) may be released from the mounting substrate 3. In a case where the restricting member 4 is omitted, if a member that generates heat (e.g. the electric circuits or control circuits) in the space that the back surface 3B of the mounting substrate 3 faces is provided, then the heat of this component may be released from the mounting substrate 3. Furthermore, the mounting substrate 3 can restrict the heat on the front surface 3A side from reaching the back surface 3B side, and can restrict the heat on the back surface side 3B from reaching the front surface 3A side.

In the fourth embodiment, at least a portion of the imaging apparatus 1 is arranged on the mounting substrate 3, and the imaging apparatus 1 includes an alignment section 6 for aligning the mounting substrate 3 and the support component 100. The alignment section 6 includes an opening 61 in which the mounting substrate 3 is arranged and an opening 62 in which the restricting member 4 is arranged. If the restricting member 4 is omitted, the alignment section 6 includes only the opening 61 and not the opening 62.

In the fourth embodiment, two alignment sections 6 are arranged around the imaging chip 2. One alignment section 6 may be arranged around the imaging chip 2, or three or more alignment sections 6 may be arranged as desired.

In the fourth embodiment, protrusions 101 of the support member 100 are arranged in the alignment section 6 (openings 61 and 62). By arranging the protrusions 101 of the support member 100 in the openings 61 and 62, the mounting substrate and the support member 100 are aligned. Furthermore, the alignment section 6 aligns the support member 100 and the imaging chip 2 that is mounted on the mounting substrate 3.

The alignment section 6 may include a protrusion arranged on at least one of the mounting substrate 3 and the restricting member 4. By arranging this protrusion in an opening formed in the support member 100, the mounting substrate 3 (imaging chip 2) and the support member 100 are aligned.

The imaging apparatus 1 includes an adjustment mechanism 7 that secures the mounting substrate 3 to the support member 100 and enables adjustment of the positions of the support member 100 and the imaging chip 2 mounted on the mounting substrate 3. In the example shown in FIGS. 19 and 20, the adjustment mechanism 7 secures the mounting substrate 3 to the support member 100 such that the front surface 2A of the imaging chip 2 is substantially parallel to the YZ plane.

In the fourth embodiment, the adjustment mechanism 7 includes an opening 71 formed in the mounting substrate 3, an opening 72 formed in the restricting member 4, and a fixing member 70 that is capable of having at least a portion thereof arranged in the openings 71 and 72.

When the mounting substrate 3 and restricting member 4 are aligned with the support member 100 by the alignment section 6, the position of the opening 71 matches the position of the opening 72. The fixing member 70 is rod-shaped, and at least a portion of the fixing member 70 can be arranged in the openings 71 and 72 with matching positions.

In the fourth embodiment, the fixing member 70 includes a male screw. The fixing member 70 includes a rod 70L having a male screw groove formed therein and a flange 70F in which one end of the rod 70L is arranged. The support member 100 has a hole 100H in which a female screw groove is formed. The rod 70L can be arranged in the hole 100H of the support member 100.

In the fourth embodiment, three sets of the openings 71 and 72 are formed around the imaging chip 2. Furthermore, three sets of the fixing member 70 and the hole 100H of the support member 100 are arranged to correspond to the openings 71 and 72. Instead, two sets or four or more sets of the holes 71 and 72 and the fixing member 70 and hole 100H of the support member 100 may be formed. As another example, one set of the holes 71 and 72 and the fixing member 70 and hole 100H of the support member 100 may be formed.

With the openings 71 and 72 formed in the fixing member 70, the rod 70L of the fixing member 70 is screwed into the hole 100H of the support member 100, thereby fixing the mounting substrate 3 and the restricting member 4 to the support member 100. By adjusting the screwing amount of the fixing member 70, the positions of the mounting substrate 3 (and the imaging chip 2 mounted on the mounting substrate 3) and the support member 100 are adjusted. For example, by adjusting the screwing amount of the fixing member 70, the position of the mounting substrate 3 (and the imaging chip 2) can be adjusted in the X-axis direction. By adjusting the screwing amount of each of a plurality of the fixing members 70, the position of the mounting substrate 3 (and the imaging chip 2) is adjusted in the θY and θZ directions.

The imaging apparatus 1 includes a cover member 9 having at least a portion thereof supported by the front surface 3A of the mounting substrate 3, and the cover member 9 forms a space between itself and the mounting substrate 3 in which the imaging chip 2 is arranged. In the fourth embodiment, the cover member 9 includes a surrounding member 92 serving as the surrounding member arranged around the imaging chip 2 and an optical element 91 supported by the surrounding member 92. The optical element 91 is arranged facing the front surface 2A of the imaging chip 2. The light from the subject is incident to the front surface 2A of the imaging chip 2 through the optical element 91. The optical element 91 may be a cover glass. The cover glass may be a glass plate.

Figure 24:
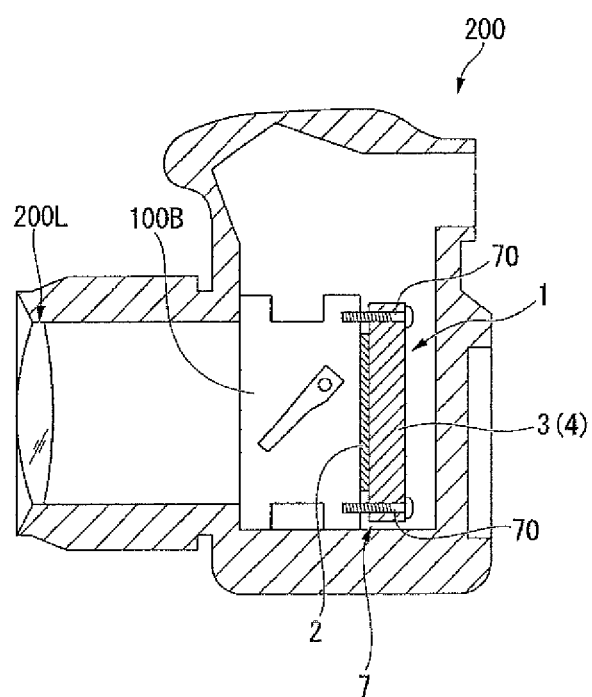
FIG. 24 is a view of an exemplary electronic camera according to the fourth embodiment.

FIG. 24 shows an exemplary electronic camera 200 including the imaging apparatus 1 according to the fourth embodiment. In the fourth embodiment, the imaging apparatus 1 is secured to the body 100B of the electronic camera 200. The fixing member 70 of the adjustment mechanism 7 secures the mounting substrate 3 to the body 100B. The adjustment mechanism 7 can adjust the positions of the imaging chip 2 and body 100B. The adjustment mechanism 7 can adjust the positions of the lens 200L of the electronic camera 200 and the imaging chip 2. For example, the adjustment mechanism 7 can adjust the position of the front surface 2A of the imaging chip 2 relative to the optical axis of the lens 200L.

Figure 25:
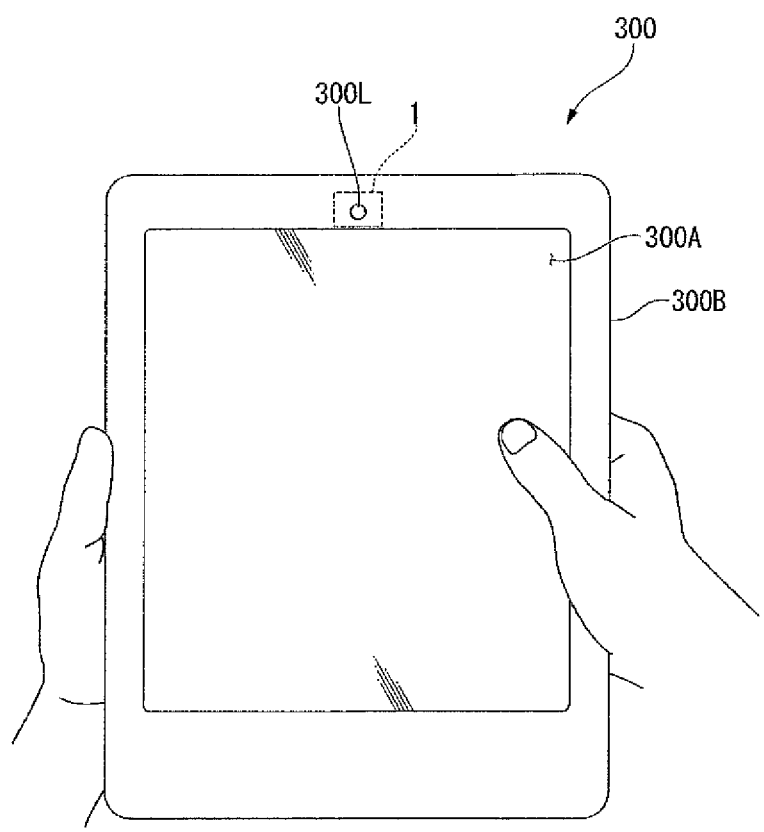
FIG. 25 is a view of an exemplary electronic device according to the fourth embodiment.

FIG. 25 shows an exemplary information terminal 300 including the imaging apparatus 1 according to the fourth embodiment. In FIG. 25, the information terminal 300 includes a display section 300A and a housing 300B that houses the imaging apparatus 1. The information terminal 300 includes a lens 300L, and light from the subject is incident to the imaging apparatus 1 through the lens 300L. The imaging apparatus 1 acquires a subject image (optical image) through the lens 300L.

The electronic device on which the imaging apparatus 1 is mounted is not limited to an electronic camera or information terminal, and may be a personal computer, mobile telephone, or the like.

As described above, with the fourth embodiment, the imaging chip 2 is mounted on the mounting substrate 3, and therefore the imaging apparatus 1 can be prevented from becoming larger. For example, in a case where the imaging chip is sealed in a package, the size of the imaging apparatus might be increased due to the need to support the package on a support substrate. With the fourth embodiment, by directly mounting the imaging chip 2 on the mounting substrate 3, the imaging apparatus 1 can be made smaller. Furthermore, with the fourth embodiment, the imaging apparatus 1 can be manufactured without sealing the imaging chip 2 in a package. With the fourth embodiment, the mounting substrate 3 can be directly secured to the support member 100 (e.g. the body 100B of the electronic camera 200). Accordingly, the manufacturing cost can be decreased.

With the fourth embodiment, a circuit board having a strong metal layer is used as the mounting substrate 3, and therefore even if the imaging chip 2 is large, the large imaging chip 2 can be suitably supported by the strong mounting substrate 3. Furthermore, since the mounting substrate 3 is strong, when the mounting substrate 3 is fixed to the support member 100 (the body 100B, etc.), the strength of the support member 100 (body 100B, etc.) can be improved. The mounting substrate 3 can also be used as a portion of the body 100B. Since the mounting substrate 3 is strong, it is possible to attach other components or mechanisms (e.g. at least a portion of the shutter mechanism of the electronic camera 100D) on the mounting substrate 3.

With the fourth embodiment, since the imaging chip 2 is directly secured to the mounting substrate 3, the length of the wire (circuit portion) can be decreased. Accordingly, a decrease in the electric characteristics of the imaging apparatus 1 can be restricted.

With the fourth embodiment, the imaging apparatus 1 can be made smaller and more dense by arranging (housing) the electronic component 5 within the mounting substrate 3. Since the distance between the imaging chip 2 and the electronic component 5 is short, a decrease in the electric characteristics of the imaging apparatus 1 can be restricted.

With the fourth embodiment, the temperature change of the imaging chip 2 can be restricted by the mounting substrate 3 that includes the circuit board having the metal layer. When the restricting member 4 is provided, the temperature change of the imaging chip 2 can be further restricted. Accordingly, a decrease in the characteristics of the imaging apparatus 1 can be restricted.

When the imaging apparatus is large, there is a possibility that the electronic device, such as an electronic camera, in which the imaging apparatus is mounted could also become large. As a result, there could be a drop in the ease of operating the electronic device. However, with the fourth embodiment, this problem is lessened.

The components of each of the embodiments described above can be combined as desired. Furthermore, some of the structural components can be omitted. Furthermore, this document incorporates all publications and disclosure of US patents that are cited by the embodiments and modifications described above, as far as allowed under the law.

The optical element 106 of the first embodiment, the optical element 160 of the second embodiment, the optical element 132 of the third embodiment, and the optical element 91 of the fourth embodiment correspond to each other. The surrounding member 105 of the first embodiment, the surrounding member 140 of the second embodiment, the surrounding member 131 of the third embodiment, and the surrounding member 92 of the fourth embodiment correspond to each other. The surrounding member may be a frame that surrounds the imaging chip. The frame may be a support structure. The frame may be a structure that supports at least the optical element.

The mounting substrate 105 of the first embodiment, the mounting substrate 120 of the second embodiment, the structural substrate 100 of the third embodiment, and the mounting substrate 3 of the fourth embodiment correspond to each other.

The resin layer 102 of the first embodiment, the prepreg layer 135 of the second embodiment, the resin layer 120 of the third embodiment, and the insulating layer 32 of the fourth embodiment correspond to each other. The wiring pattern formed on the resin layer 102 of the first embodiment, the wiring pattern 135 of the second embodiment, the circuit pattern of the third embodiment, and the circuit board of the mounting substrate 3 of the fourth embodiment correspond to each other.

The metal layers 103, 113, 123, and 133 of the first embodiment, the core layer 123 of the second embodiment, the metal layer 110 of the third embodiment, and the metal layer 31 of the fourth embodiment correspond to each other. The metal layers 103, 113, 123, and 133 of the first embodiment, the core layer 123 of the second embodiment, the metal layer 110 of the third embodiment, and the metal layer 31 of the fourth embodiment are intermediate layers that are sandwiched by and in contact with two other layers. The metal layers 103, 113, 123, and 133 of the first embodiment, the core layer 123 of the second embodiment, the metal layer 110 of the third embodiment, and the metal layer 31 of the fourth embodiment are formed to include metal, but these layers need not include metal. For example, these layers may be formed of resin. As another example, these layers may be formed of an insulating material such as resin with high rigid strength. If these layers are formed of resin, they are treated as a resin core. As an example, FR4 can be used as the insulating material with high rigid strength.

Any combination of the components described in the first to fourth embodiments above can be adopted in an imaging unit, imaging apparatus, or the like. For example, any combination of corresponding components described in the first to fourth embodiments above can be adopted.

Figure 26:
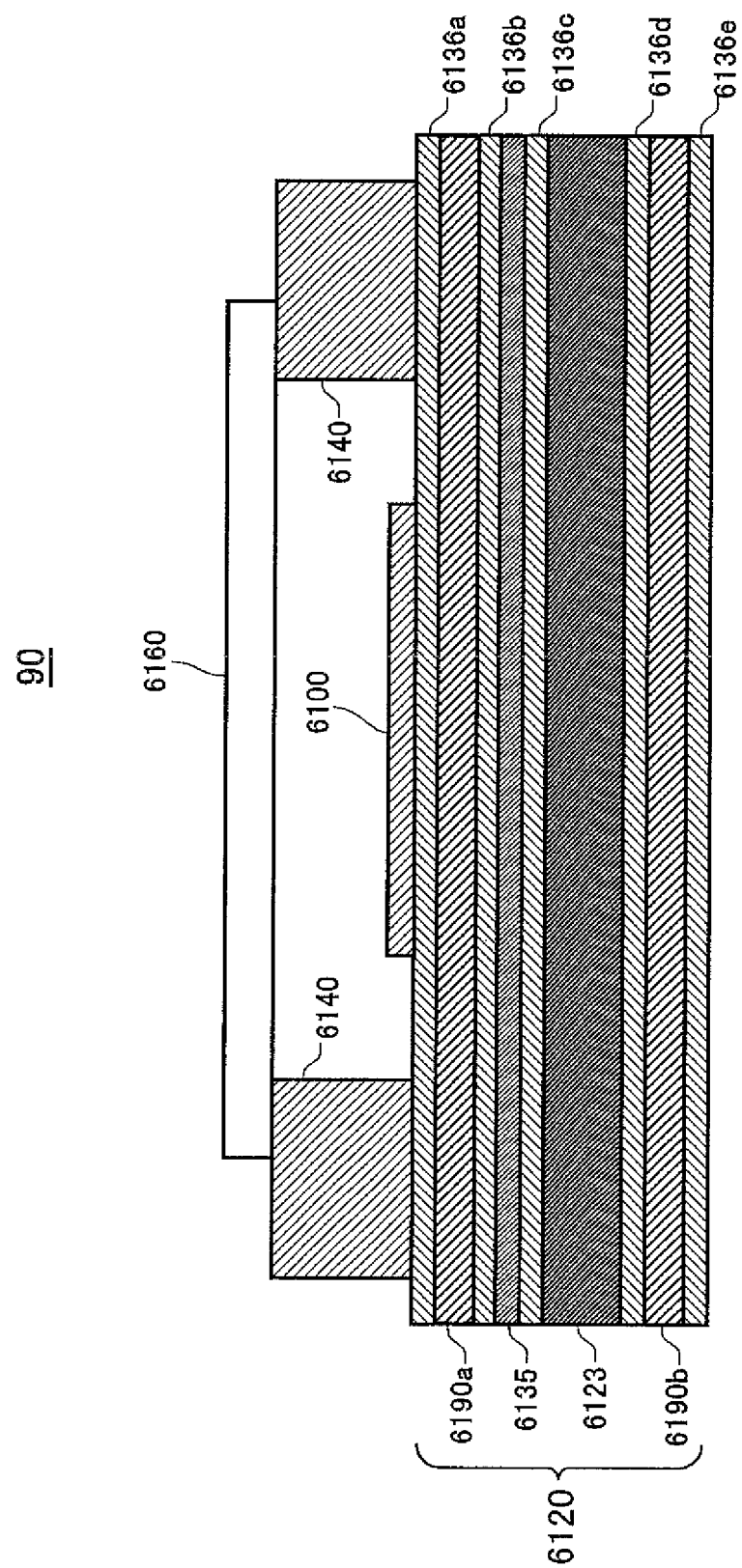
FIG. 26 is a schematic cross-sectional view of an imaging unit 90.

FIG. 26 shows the configuration of an imaging unit 90 according to the fifth embodiment. The imaging unit 90 includes an imaging chip 6100, a mounting substrate 6120, a surrounding member 6140 that surrounds the imaging chip 6100, and an optical element 6160. The mounting substrate 6120 includes an insulating layer 6136*a*, an insulating layer 6136*b*, an insulating layer 6136*c*, an insulating layer 6136*d*, an insulating layer 6136*e*, a first metal layer 6135, a second metal layer 6123, a third metal layer 6190*a*, and a fourth metal layer 6190*b*.

The optical element 6160 in the imaging unit 90 corresponds to the optical element 106 of the first embodiment, the optical element 160 of the second embodiment, the optical element 132 of the third embodiment, and the optical element 91 of the fourth embodiment.

The surrounding member 6140 corresponds to the surrounding member 105 of the first embodiment, the surrounding member 140 of the second embodiment, the surrounding member 131 of the third embodiment, and the surrounding member 92 of the fourth embodiment.

The mounting substrate 6120 corresponds to the mounting substrate 105 of the first embodiment, the mounting substrate 120 of the second embodiment, the structural substrate 100 of the third embodiment, and the mounting substrate 3 of the fourth embodiment.

The insulating layer 6136*a*, insulating layer 6136*b*, insulating layer 6136*c*, insulating layer 6136*d*, and insulating layer 6136*e* are resin layers, for example. The insulating layer 6136*a*, insulating layer 6136*b*, insulating layer 6136*c*, insulating layer 6136*d*, and insulating layer 6136*e* correspond to the resin layer 102 of the first embodiment, the prepreg layer 135 of the second embodiment, the resin layer 120 of the third embodiment, and the insulating layer 32 of the fourth embodiment The first metal layer 6135 is a wire layer, for example. The first metal layer 6135 corresponds to the wiring pattern formed on the resin layer 102 of the first embodiment, the wiring pattern 135 of the second embodiment, the circuit pattern of the third embodiment, and the circuit board of the mounting substrate 3 of the fourth embodiment.

The second metal layer 6123 is an example of an intermediate layer. The second metal layer 6123 is an example of a core layer. The second metal layer 6123 corresponds to the metal layers 103, 113, 123, and 133 of the first embodiment, the core layer 123 of the second embodiment, the metal layer 110 of the third embodiment, and the metal layer 31 of the fourth embodiment Accordingly, the imaging chip 6100, the surrounding member 6140, the optical element 6160, the insulating layer 6136*a*, the insulating layer 6136*b*, the insulating layer 6136*c*, the insulating layer 6136*d*, the insulating layer 6136*e*, the first metal layer 6135, and the second metal layer 6123 of the imaging unit 90 adopt the same function and configuration as the corresponding components in the first to fourth embodiments, and therefore redundant description of these components is omitted.

In the mounting substrate 6120, the imaging chip 6100, the insulating layer 6136*a*, the third metal layer 6190*a*, the insulating layer 6136*b*, the first metal layer 6135, the insulating layer 6136*c*, the second metal layer 6123, the insulating layer 6136*d*, the fourth metal layer 6190*b*, and the insulating layer 6136*e* are arranged along the optical axis in the stated order. The imaging chip 6100 is mounted on the insulating layer 6136*a*.

The third metal layer 6190*a* is positioned on the surface of the insulating layer 6136*a* that faces away from the surface on which the imaging chip 6100 is mounted. The third metal layer 6190*a* is sandwiched by and in contact with the insulating layer 6136*a* and the insulating layer 6136*b*. The first metal layer 6135 is sandwiched by the insulating layer 6136*b* and the insulating layer 6136*c*. The second metal layer 6123 is sandwiched by the insulating layer 6136*c* and the insulating layer 6136*d*. The third metal layer 6190*b* is sandwiched by the insulating layer 6136*d* and the insulating layer 6136*e*.

The material of the third metal layer 6190*a* may be copper, a nickel alloy, iron, or aluminum, for example. The third metal layer 6190*a* is a thick copper layer, for example. The third metal layer 6190*a* may be a substantially metallic flat board. The third metal layer 6190*a* may be used as a ground. The third metal layer 6190*a* may be used as a wire. The material of the fourth metal layer 6190*b* may be copper, a nickel alloy, iron, or aluminum, for example. The fourth metal layer 6190*b* is a thick copper layer, for example. The fourth metal layer 6190*b* may be a substantially metallic flat board. The fourth metal layer 6190*b* may be used as a ground. The fourth metal layer 6190*b* may be used as a wire.

The third metal layer 6190*a* and the fourth metal layer 6190*b* are provided in the mounting substrate 6120, but the it is also acceptable to provide only of the third metal layer 6190*a* and the fourth metal layer 6190*b*. When only the third metal layer 6190*a* is provided, the third metal layer 6190*a* may be provided on the imaging chip 6100 side of the second metal layer 6123. The third metal layer 6190*a* may be provided on the imaging chip 6100 side of the second metal layer 6123, and on the imaging chip 6100 side of the first metal layer 6135. The third metal layer 6190*a* may be provided on the metal layer of the mounting substrate 6120 that is farthest to the imaging chip 6100 side. By providing the third metal layer 6190a at a position closer than the imaging chip 6100, the mounting surface of the mounting substrate 6120 on which the imaging chip 6100 is mounted can be made flatter. Furthermore, the levelness of the imaging chip 6100 mounted on the mounting substrate 6120 can be improved.

In the mounting substrate 6120, in addition to the third metal layer 6190a and the fourth metal layer 6190b, one or more metal layers may be provided that have the same rigid strength as the third metal layer 6190a and the fourth metal layer 6190b. In this way, the mounting surface of the mounting substrate 6120 on which the imaging chip 6100 is mounted can be made flatter. Furthermore, the levelness of the imaging chip 6100 mounted on the mounting substrate 6120 can be improved.

In the mounting substrate 6120, in addition to the third metal layer 6190a and the fourth metal layer 6190b, one or more metal layers may be provided that have the same thickness as the third metal layer 6190a and the fourth metal layer 6190b. In this way, the mounting surface of the mounting substrate 6120 on which the imaging chip 6100 is mounted can be made flatter. Furthermore, the levelness of the imaging chip 6100 mounted on the mounting substrate 6120 can be improved.

The second metal layer 6123 has higher rigid strength than the third metal layer 6190a. The second metal layer 6123 has higher rigid strength than the fourth metal layer 6190b. The second metal layer 6123 has higher rigid strength than the layers included in the mounting substrate 6120. The second metal layer 6123 may be used as a ground. The second metal layer 6123 may be used as a wire.

The thickness of the insulating layer 6136 is approximately from 30 μm to 40 μm. The thickness of the first metal layer 6135 is approximately from 30 μm to 40 μm. The thickness of the third metal layer 6190a is approximately from 30 μm to 50 μm. The thickness of the fourth metal layer 6190b is approximately from 30 μm to 50 μm. The thickness of the second metal layer 6123 is approximately from 100 μm to 400 μm. When the second metal layer 6123 is formed of metal, for example, the thickness of the second metal layer 6123 is approximately from 100 μm to 400 μm. The thickness of the second metal layer 6123 is greater than the thickness of the third metal layer 6190a. The thickness of the second metal layer 6123 is greater than the thickness of the fourth metal layer 6190b. The second metal layer 6123 has the greatest thickness among the layers contained in the mounting substrate 6120.

The second metal layer 6123 has at least twice the thickness of the third metal layer 6190a. The second metal layer 6123 may have 10 or more times the thickness of the third metal layer 6190a. The thickness of the third metal layer 6190a may be greater than the thickness of the first metal layer 6135. The thickness of the third metal layer 6190a may be greater than the thickness of each of the insulating layer 6136a, the insulating layer 6136b, the insulating layer 6136c, the insulating layer 6136d, and the insulating layer 6136e. The thickness of the fourth metal layer 6190b may be greater than the thickness of the first metal layer 6135. The thickness of the fourth metal layer 6190b may be greater than the thickness of each of the insulating layer 6136a, the insulating layer 6136b, the insulating layer 6136c, the insulating layer 6136d, and the insulating layer 6136e. The thickness of the mounting substrate 6120 may be approximately from 0.8 mm to 3 mm. The thickness of the mounting substrate 6120 may be at least double the thickness of the second metal layer 6123. The thickness of the mounting substrate 6120 may be at most three times the thickness of the second metal layer 6123.

In the mounting substrate 6120, in addition to the first metal layer 6135, there may be one or more metal layers that have the same rigid strength as the first metal layer 6135. In this case, the metal layer may be provided on the imaging chip 6100 side of the second metal layer 6123, or may be provided on the side of the second metal layer 6123 opposite the imaging chip 6100. The first metal layer 6135 need not be provided in the mounting substrate 6120. In this case, one or more metal layers 1031 with the same rigid strength as the first metal layer 6135 are provided on the side of the second metal layer 6123 opposite the imaging chip 6100.

In stead of the second metal layer 6123, the intermediate layer may be formed of resin. When the intermediate layer is formed of resin instead of the second metal layer 6123, the thickness of the intermediate layer is approximately from 200 μm to 400 μm. When the intermediate layer is formed of resin instead of the second metal layer 6123, the intermediate layer in the mounting substrate 6120 may be sandwiched by and in contact with a plurality of metal layers, may be sandwiched by and in contact with a plurality of resin layers, or may be sandwiched by and in contact with a metal layer and a resin layer.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention. Corresponding components shared among the embodiments described above may be given the same reference numerals, but this is not always the case. There may also be cases where components that do not correspond to each other are given the same reference numeral.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. An imaging unit comprising:
   an imaging chip that images a subject;
   a substrate that has the imaging chip arranged thereon;
   a member that (i) is arranged on the substrate so as to surround at least part of the imaging chip, (ii) is provided with an attaching portion for attaching another structure, and (iii) includes a metal member and a resin member; and
   an optical element that is fixed to the member in a manner to form a sealed space together with the substrate and the member, wherein:
   the attaching portion is a through-hole that penetrates through the member, and
   the metal member forms a portion of an inner wall surface of the attaching portion.

2. The imaging unit according to claim 1, further comprising:
   an active element that is arranged on the substrate and drives the imaging chip, wherein:

the substrate includes (i) a first layer including a first wire connected to the imaging chip, (ii) a second layer including a second wire connected to the active element, and (iii) a third layer arranged between the first and second layers and having rigidity higher than that of the first and second layers, and the first layer includes a first heat transfer path that transfers heat generated by the imaging chip to the third layer.

3. The imaging unit according to claim 2, wherein the first heat transfer path is formed by thermal vias.

4. The imaging unit according to claim 3, wherein the imaging chip includes an imaging region having a plurality of pixels and a peripheral region around the imaging region, and the thermal vias are provided at least in a region corresponding to the peripheral region.

5. The imaging unit according to claim 4, wherein the density of thermal vias provided in the region corresponding to the peripheral region is greater than the density of thermal vias provided in a region corresponding to the imaging region.

6. The imaging unit according to claim 4, wherein the imaging chip includes an A/D conversion circuit in the peripheral region, and the thermal vias are provided in a region corresponding to the A/D conversion circuit.

7. The imaging unit according to claim 2, wherein the first layer of the substrate further includes a second heat transfer path that transfers heat of the third layer to the metal member.

8. The imaging unit according to claim 7, wherein the second heat transfer path is formed by a thermal via.

9. The imaging unit according to claim 1, wherein an end surface of the metal member on the imaging chip side is covered by the resin member.

10. The imaging unit according to claim 1, wherein the member is a surrounding member.

11. The imaging unit according to claim 1, wherein thickness of a portion of the member that is sandwiched between the substrate and the optical element is different from thickness of a portion of the member where the attaching portion is formed.

12. The imaging unit according to claim 1, wherein the member further includes a positioning section that shows a positional reference for the imaging chip.

13. An imaging apparatus comprising the imaging unit according to claim 1.

14. The imaging unit according to claim 2, wherein the active element constitutes a regulator that supplies power to the imaging chip.

15. The imaging unit according to claim 2, wherein the active element is mounted on a surface of the substrate, the surface facing away from a surface on which the imaging chip is mounted.

16. The imaging unit according to claim 15, wherein the active element constitutes a regulator that supplies power to the imaging chip.

17. The imaging unit according to claim 15, wherein the active element is arranged on a region of the surface of the substrate facing away from a region, on which the imaging chip is mounted, of the surface on which the imaging chip is mounted.

18. The imaging unit according to claim 17, wherein the active element constitutes a regulator that supplies power to the imaging chip.

19. The imaging unit according to claim 2, wherein the active element is connected to the second wire by solders.

20. The imaging unit according to claim 19, wherein the active element is mounted on a surface of the substrate, the surface facing away from a surface on which the imaging chip is mounted.

21. The imaging unit according to claim 20, wherein the active element is arranged on a region of the surface of the substrate facing away from a region, on which the imaging chip is mounted, of the surface on which the imaging chip is mounted.

22. The imaging unit according to claim 21, wherein the active element constitutes a regulator that supplies power to the imaging chip.

23. The imaging unit according to claim 2, wherein the third layer is a core layer formed of a metal.

24. The imaging unit according to claim 2, wherein the third layer is a core layer formed of a resin.

* * * * *